United States Patent
Lai et al.

(10) Patent No.: US 12,482,766 B2
(45) Date of Patent: Nov. 25, 2025

(54) MIMCAP CORNER STRUCTURES IN THE KEEP-OUT ZONES OF A SEMICONDUCTOR DIE AND METHODS OF FORMING THE SAME

(71) Applicant: Taiwan Semiconductor Manufacturing Company Limited, Hsinchu (TW)

(72) Inventors: Yen-Kun Lai, New Taipei (TW); Chien Hao Hsu, Zhubei (TW); Wei-Hsiang Tu, Hsinchu (TW); Kuo-Chin Chang, Chiayi (TW); Mirng-Ji Lii, Sinpu Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 659 days.

(21) Appl. No.: 17/709,808

(22) Filed: Mar. 31, 2022

(65) Prior Publication Data

US 2023/0317641 A1    Oct. 5, 2023

(51) Int. Cl.
| | |
|---|---|
| *H01L 23/64* | (2006.01) |
| *H01L 23/00* | (2006.01) |
| *H01L 23/498* | (2006.01) |
| *H01L 25/065* | (2023.01) |
| *H01L 25/10* | (2006.01) |

(Continued)

(52) U.S. Cl.
CPC ............ *H01L 23/642* (2013.01); *H01L 24/16* (2013.01); *H01L 24/32* (2013.01); *H01L 24/73* (2013.01); *H01L 25/105* (2013.01); *H10D 1/692* (2025.01); *H10D 84/01* (2025.01); *H01L 23/49816* (2013.01); *H01L 23/49822* (2013.01); *H01L 23/49833* (2013.01); *H01L 23/49838* (2013.01); *H01L 25/0657* (2013.01); *H01L 2224/16227* (2013.01); *H01L 2224/16238* (2013.01); *H01L 2224/32227* (2013.01); *H01L 2224/32238* (2013.01); *H01L 2224/73204* (2013.01); *H01L 2225/06513* (2013.01); *H01L 2225/06524* (2013.01)

(58) Field of Classification Search
CPC ....... H01L 21/82; H01L 23/642; H01L 24/73; H01L 24/16; H01L 25/0657; H01L 25/105; H01L 28/60; H01L 2224/32227
USPC ........................................................ 257/690
See application file for complete search history.

(56) References Cited

U.S. PATENT DOCUMENTS 11,854,956 B2 * 12/2023 Lee .................. H01L 23/49822

FOREIGN PATENT DOCUMENTS

JP      2009-081351 A  *  4/2009  ........... H01L 23/564

* cited by examiner

*Primary Examiner* — Jasmine J Clark
(74) *Attorney, Agent, or Firm* — The Marbury Law Group, PLLC

(57) ABSTRACT

A semiconductor die includes semiconductor devices located on a semiconductor substrate, metal-insulator-metal corner structures overlying the semiconductor devices and located in corner regions of the semiconductor die. Metal-insulator-metal corner structures are located in the corner regions of the semiconductor die. Each of the metal-insulator-metal corner structures has a horizontal cross-sectional shape selected from a triangular shape and a polygonal shape including a pair of laterally-extending strips extending along two horizontal directions that are perpendicular to each other and connected to each other by a connecting shape.

19 Claims, 16 Drawing Sheets

(51) Int. Cl.
*H10D 1/68* (2025.01)
*H10D 84/01* (2025.01)

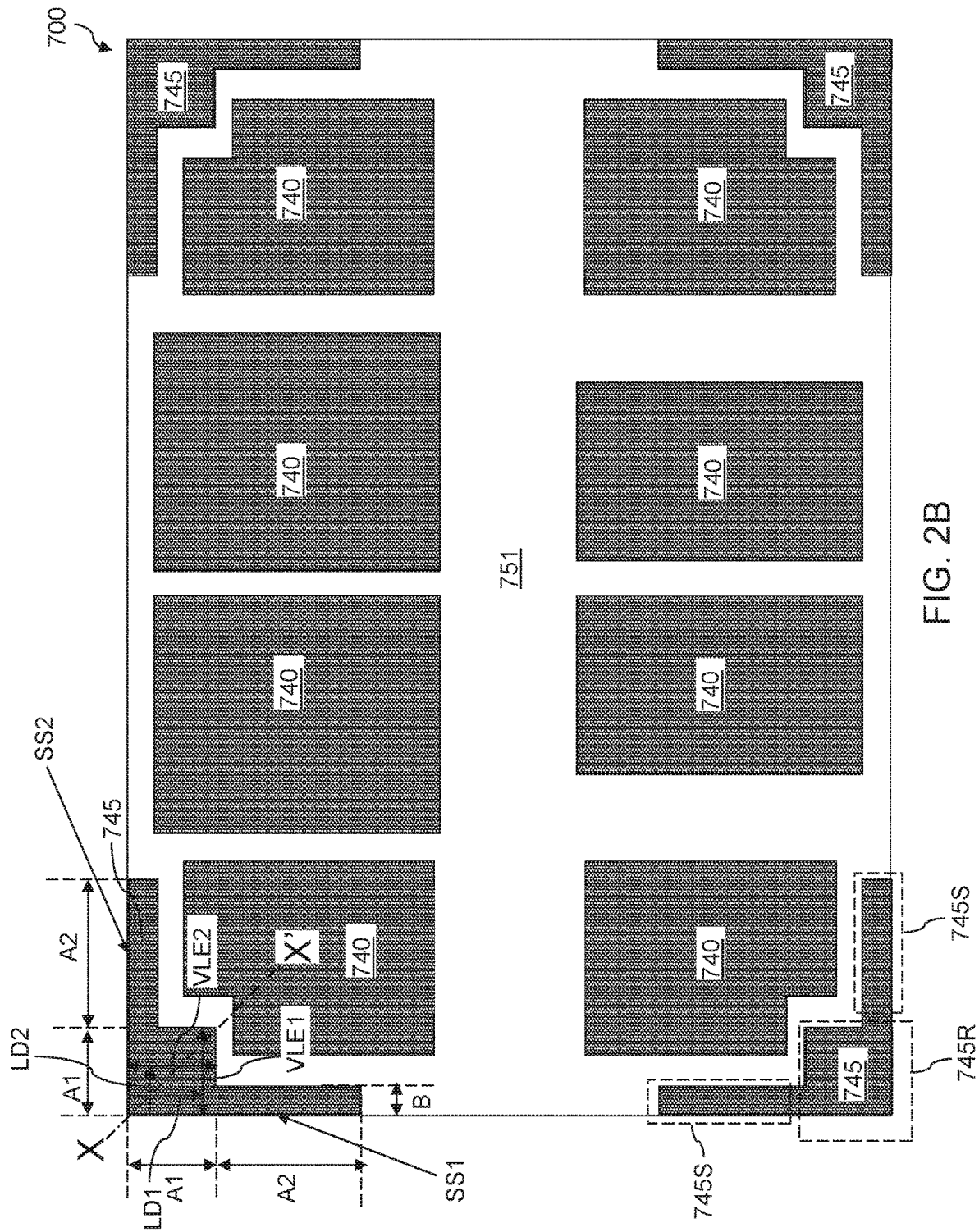

MIMCAP CORNER STRUCTURES IN THE KEEP-OUT ZONES OF A SEMICONDUCTOR DIE AND METHODS OF FORMING THE SAME

BACKGROUND

Mechanical shock applied to corner regions of a semiconductor die during a packaging process or during usage may damage the semiconductor die. Effective low-cost methods of protecting a semiconductor die from mechanical shocks are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a top-down view of a second configuration of the exemplary semiconductor die of FIG. 1C according to an embodiment of the present disclosure.

DETAILED DESCRIPTION

Figure 1A:
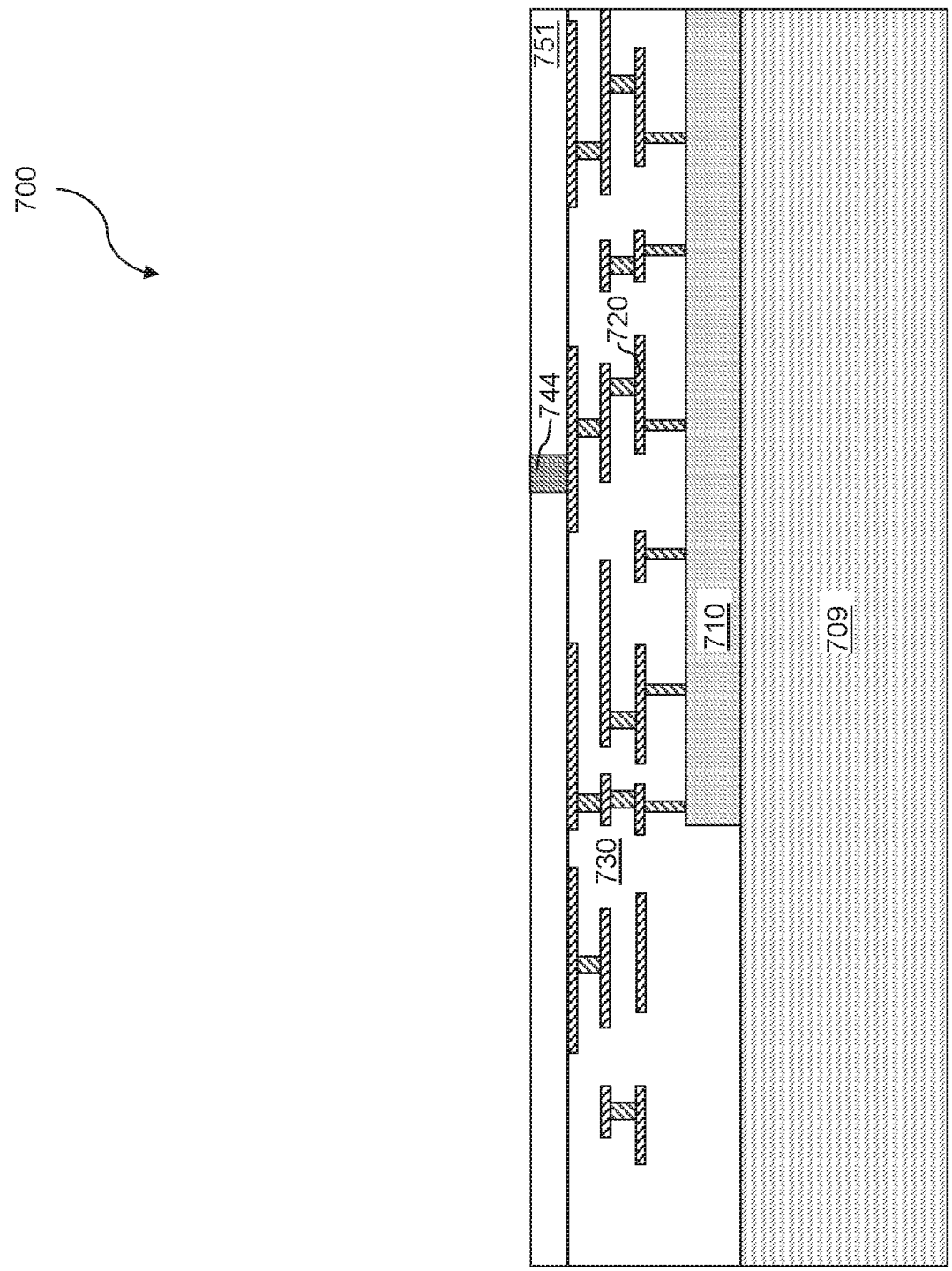
FIG. 1A is a vertical cross-sectional view of a region of an exemplary semiconductor die after formation of a lower passivation layer and lower contact via structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein are directed to semiconductor dies, and particularly to semiconductor dies including metal-insulator-metal corner structures located in keep-out zones (KOZ's), such as super high density metal-insulator-metal (SHDMIM) capacitors. Various embodiments disclosed herein are configured to provide structural protection to the semiconductor die by preventing propagation of mechanical cracks in a passivation dielectric layer and methods of manufacturing the same.

Referring to FIG. 1A, a region of an exemplary semiconductor die 700 is illustrated. The exemplary semiconductor die 700 may be one of a two-dimensional array of the semiconductor dies 700 that are formed on a semiconductor substrate 709. The semiconductor substrate 709 may comprise a commercially available semiconductor wafer such as a single crystalline silicon wafer having a diameter of 450 mm, 300 mm, 200 mm, etc. Generally, the semiconductor substrate 709 includes a semiconductor material layer at least at an upper portion thereof. The semiconductor substrate 709 may comprise a bulk single crystalline silicon substrate or a semiconductor-on-insulator (SOI) substrate including a top semiconductor layer.

Semiconductor devices 710 may be formed in, and/or on, an upper portion of the semiconductor substrate 709. The semiconductor devices 710 may comprise any type of semiconductor devices known in the art. In an illustrative example, the semiconductor devices 710 may comprise field effect transistors, bipolar transistors, diodes, resistors, capacitors, inductors, and/or other types of semiconductor devices.

Metal interconnect structures 720 and dielectric material layers 730 may be formed over the semiconductor devices 710. The metal interconnect structures 720 may comprise contact via structures, metal lines, and connection via structures. The contact via structures may be formed at a contact level, and may contact an electrical node of a respective one of the semiconductor devices 710. For example, the contact via structures may contact source/drain regions and gate electrodes of field effect transistors. The metal lines may be formed in metal line levels, and the connection via structures may be formed in metal via levels that are interlaced with the metal line levels along the vertical direction. Single damascene methods or dual damascene methods may be used to form the various metal interconnect structures 720. The dielectric material layers 730 may provide dielectric matrices in which the metal interconnect structures are embedded. Generally, the metal interconnect structures 720 may be formed within the dielectric material layers 730, and may be electrically connected to the semiconductor devices 710.

A lower passivation layer 751 may be formed on the metal interconnect structures 720 and the dielectric material layers 730. The lower passivation layer 751 comprises a dielectric passivation material that may block diffusion of impurity atoms such as hydrogen atoms, oxygen atoms, fluorine atoms, carbon atoms, and metal atoms. For example, the lower passivation layer 751 may comprise silicon nitride or silicon carbide nitride. Other suitable passivation materials are within the contemplated scope of disclosure. The thickness of the lower passivation layer 751 may be in a range from 50 nm to 500 nm, although lesser and greater thicknesses may also be used.

Bottom electrode contact via structures 744 may be formed through the lower passivation layer 751. The bottom electrode contact via structures 744 may be formed in areas in which metal-insulator-metal capacitor structures are to be subsequently formed.

Figure 1B:
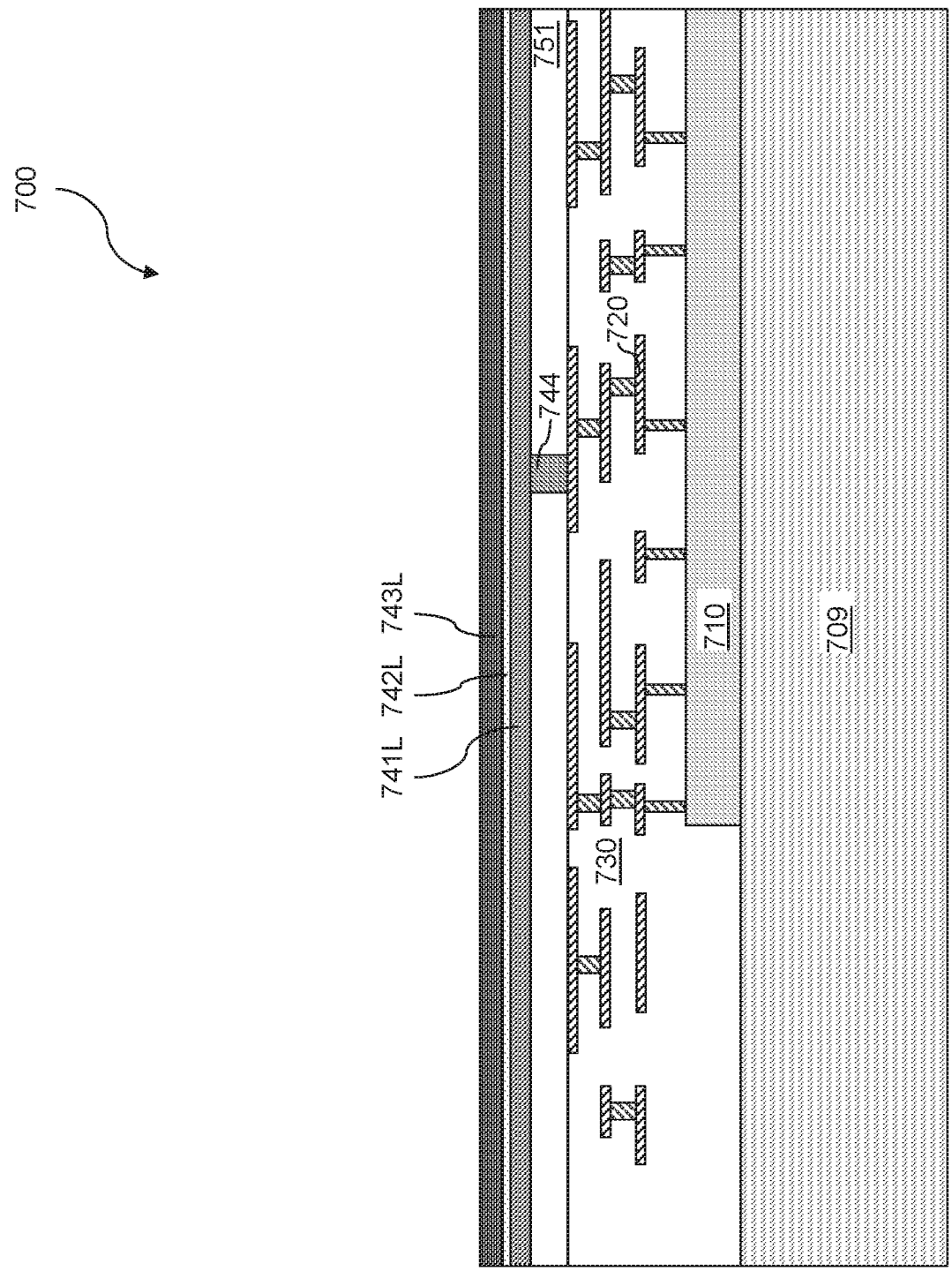
FIG. 1B is a vertical cross-sectional view of the region of the exemplary semiconductor die after formation of a metal-insulator-metal (MIM) layer stack including a lower electrode material layer, a node dielectric material layer, and an upper electrode material layer according to an embodiment of the present disclosure.

Referring to FIG. 1B, a layer stack including a bottom electrode material layer 741L, a node dielectric material layer 742L, and a top electrode material layer 743L may be formed over the metal interconnect structures 720 and the lower passivation layer 751. The bottom electrode material layer 741L includes a conductive material, which may be a metallic material. For example, the bottom electrode material layer 741L may comprise, or consist essentially of, at least one metallic material such as TiN, TaN, WN, MoN, TiC, TaC, WC, Ti, Ta, W, Mo, Co, Ru, etc. Other suitable metallic materials are within the contemplated scope of disclosure. The bottom electrode material layer 741L may be deposited by a conformal deposition process (such as a chemical vapor deposition process) or a non-conformal deposition process (such as a physical vapor deposition process). The thickness of the bottom electrode material layer 741L may be in a range from 10 nm to 100 nm, although lesser and greater thicknesses may also be used.

The node dielectric material layer 742L comprises a dielectric material having a dielectric constant greater than 7.9, which is the dielectric constant of silicon nitride. For example, the node dielectric material layer 742L may comprise a dielectric metal oxide material such as aluminum oxide, lanthanum oxide, yttrium oxide, hafnium oxide, titanium oxide, tantalum pentoxide, zirconium oxide, barium-strontium-titanate (BST), strontium-titanate-oxide (STO), lead-zirconium-titanate (PZT), etc. Other suitable dielectric materials are within the contemplated scope of disclosure. The thickness of the node dielectric material layer 742L may be in a range from 1 nm to 10 nm, although lesser and greater thicknesses may also be used. The node dielectric material layer 742L may be deposited by a conformal deposition process such as on atomic layer deposition process.

The top electrode material layer 743L includes a conductive material, which may be a metallic material. For example, the top electrode material layer 743L may comprise, or consist essentially of, at least one metallic material such as TiN, TaN, WN, MoN, TiC, TaC, WC, Ti, Ta, W, Mo, Co, Ru, etc. Other suitable metallic materials are within the contemplated scope of disclosure. The material of the top electrode material layer 743L may be the same as, or may be different from, the material of the bottom electrode material layer 741L. The top electrode material layer 743L may be deposited by a conformal deposition process (such as a chemical vapor deposition process) or a non-conformal deposition process (such as a physical vapor deposition process). The thickness of the top electrode material layer 743L may be in a range from 30 nm to 300 nm, although lesser and greater thicknesses may also be used.

The layer stack of the bottom electrode material layer 741L, the node dielectric material layer 742L, and the top electrode material layer 743L may comprise a stack of a bottom metal layer, the node dielectric material layer 742L, and a top metal layer, and may be referred to as a metal-insulator-metal (MIM) layer stack.

Referring to FIGS. 1C and 2A-2C, a photoresist layer may be applied over the MIM layer stack (741L, 742L, 743L), and may be lithographically patterned to form discrete patterned photoresist material portions covering a respective area. A subset of the patterned photoresist material portions covers areas in which capacitor structures may be subsequently formed. According to an aspect of the present disclosure, another subset of the patterned photoresists material portions may be formed in keep-out zones (KOZ's) located in corner regions of each semiconductor die 700. Specifically, in embodiments in which each semiconductor die 700 may be formed as a respective rectangular die area, four corner regions of the respective die area corresponds to the keep-out zones.

As used herein, a keep-out zone refers to a zone from which components of any electrical devices may be excluded. Any electrically conductive material that may be present in a keep out zone does not function as a node any electrical device, and is either electrically floating or is electrically grounded. Thus, each keep-out zone is an exclusion zone from which all passive or active electrical devices may be banned by design. As a corollary, any structure formed within a keep-out zone may not be an electrical device that is used for operation of the semiconductor die 700. The semiconductor devices 710 are located outside the area of the keep-out zones. Thus, any patterned portion of the MIM layer stack (741L, 742L, 743L) to be subsequently formed in the keep-out zones is not an active component or a passive component that is functionally utilized during operation of the semiconductor die 700 after completion of manufacture of the semiconductor die 700. Each keep-out zone is a portion of a semiconductor die 700 located within a respective area that is proximal to a corner of the semiconductor die 700. Each keep-out zone is free of any electrically conductive material that is not electrically grounded and is not electrically floating. In other words, each keep-out zone may be free of any electrically conductive material, or may comprise at least one electrically conductive material such that the entirety of any electrically conductive material in the keep-out zone is either electrically grounded or is electrically floating.

An etch process including a sequence of etch steps may be performed to etch portions of the MIM layer stack (741L, 742L, 743L) that are not masked by patterned portions of the photoresists layer. Remaining portions of the MIM layer stack (741L, 742L, 743L) located outside the keep-out zones (KOZ's) comprise metal-insulator-metal capacitor structures 740. Remaining portions of the MIM layer stack (741L, 742L, 743L) located inside the keep-out zones (KOZ's) comprise metal-insulator-metal corner structures 745. Remaining portions of the photoresists layer may be subsequently removed, for example, by ashing.

Each metal-insulator-metal capacitor structure 740 comprises a layer stack including, from bottom to top, a bottom capacitor plate 741, a node dielectric layer 742, and a top capacitor plate 743. The bottom capacitor plate 741 may be a patterned portion of the bottom electrode material layer 741L. The node dielectric layer 742 may be a patterned portion of the node dielectric material layer 742L. The top capacitor plate 743 may be a patterned portion of the top electrode material layer 743L.

Each metal-insulator-metal corner structure 745 comprises a layer stack including, from bottom to top, a bottom corner plate 746, a dielectric corner plate 747, and a top corner plate 748. The bottom corner plate 746 may be a patterned portion of the bottom electrode material layer 741L. The dielectric corner plate 747 may be a patterned portion of the node dielectric material layer 742L. The top corner plate 748 may be a patterned portion of the top electrode material layer 743L.

Each metal-insulator-metal capacitor structure 740 may be located at a same vertical distance from the semiconductor substrate 709 as the metal-insulator-metal corner structures 745 may be from the semiconductor substrate 709. Each bottom capacitor plate 741 may be located at a same vertical distance from the semiconductor substrate 709 as the bottom corner plates 746 may be from the semiconductor substrate 709. Each node dielectric layer 742 may be located at a same vertical distance from the semiconductor substrate 709 as the dielectric corner plates 747 may be from the semiconductor substrate 709. Each top capacitor plate 743 may be located at a same vertical distance from the semiconductor substrate 709 as the top corner plates 748 may be from the semiconductor substrate 709. Each bottom capacitor plate 741 may have the same material composition and the same thickness as the bottom corner plates 746. Each node dielectric layer 742 may have the same material composition and the same thickness as the dielectric corner plates 747. Each top capacitor plate 743 may have the same material composition and the same thickness as the top corner plates 748.

Generally, patterned portions of the MIM layer stack (741L, 742L, 743L) comprise at least one metal-insulator-metal capacitor structure 740 and metal-insulator-metal corner structures 745. The metal-insulator-metal corner structures 745 may be formed in the keep-out zones (KOZ's) (i.e., corner regions) of each semiconductor die 700 that are located at corner regions of the respective semiconductor die 700. Metal interconnect structures 720 electrically connected to the semiconductor devices 710 and located within (i.e., embedded within) the dielectric material layers 730 may be interposed between the semiconductor devices 710 and a horizontal plane including bottom surfaces of the metal-insulator-metal corner structures 745 and each metal-insulator-metal capacitor structure 740. In one embodiment, four metal-insulator-metal corner structures 745 may be formed in each of the four keep-out zones (KOZ's) of each semiconductor die 700.

Figure 2A:
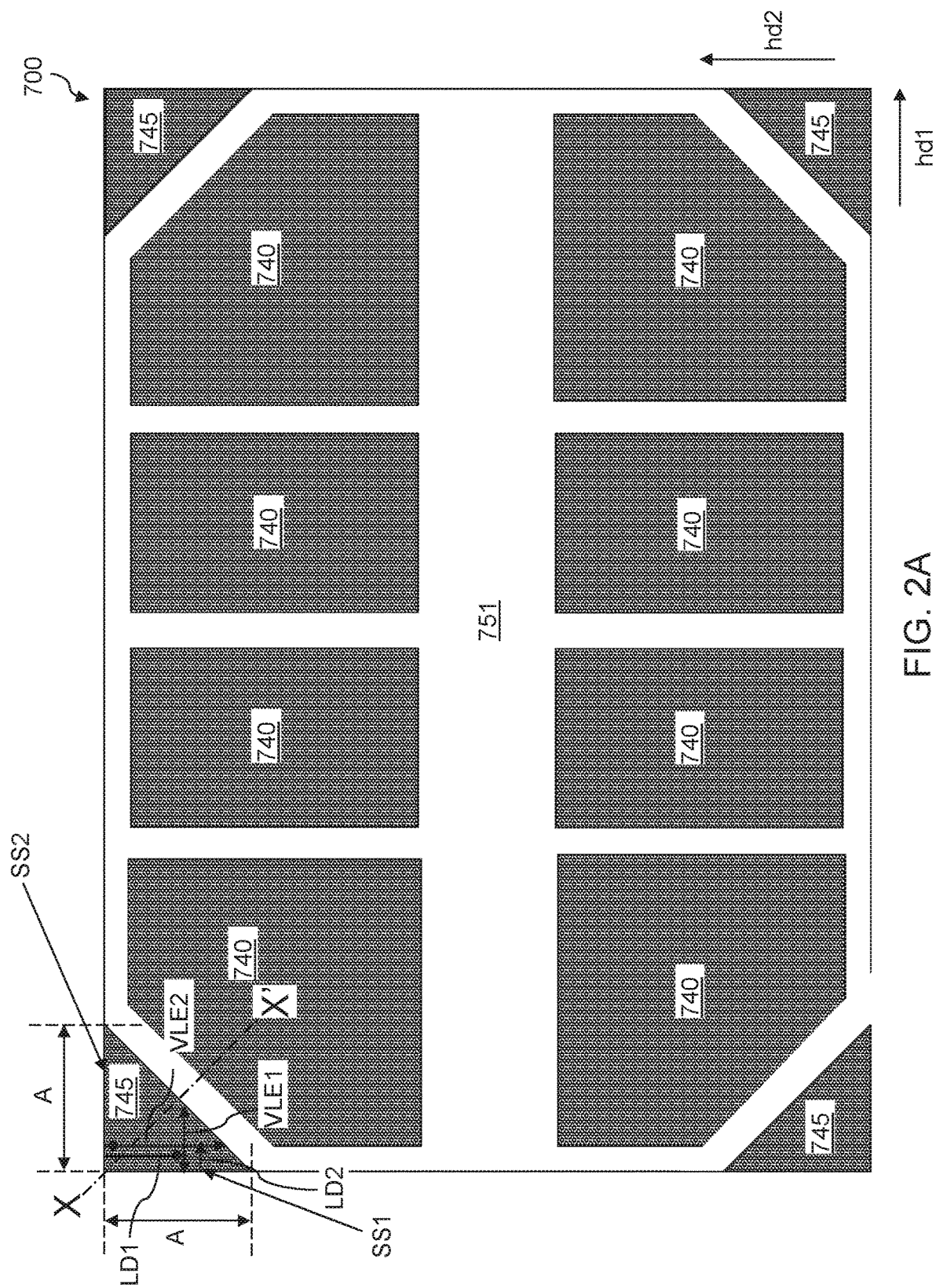
FIG. 2A is a top-down view of a first configuration of the exemplary semiconductor die of FIG. 1C according to an embodiment of the present disclosure.
Figure 2C:
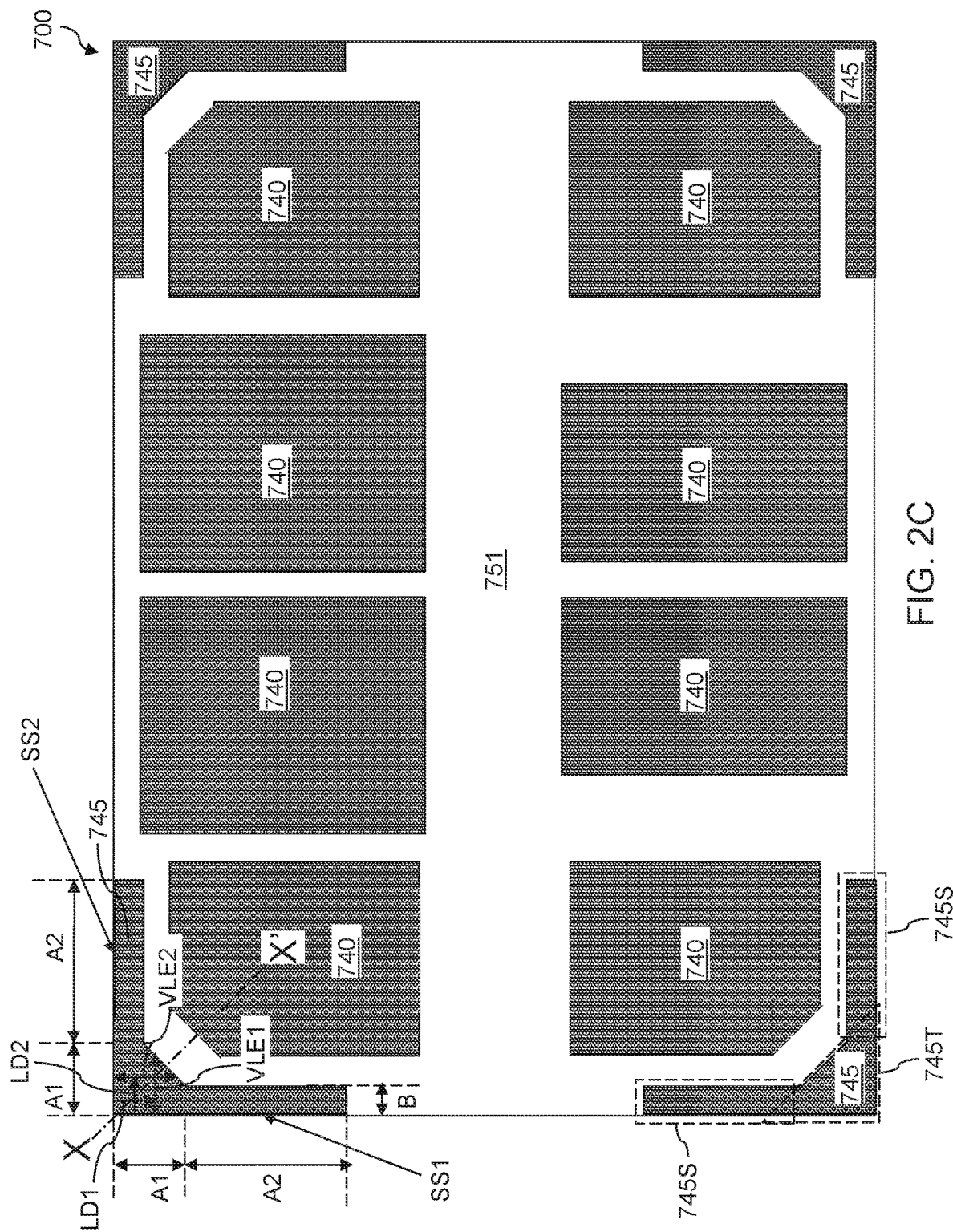
FIG. 2C is a top-down view of a third configuration of the exemplary semiconductor die of FIG. 1C according to an embodiment of the present disclosure.

According to an aspect of the present disclosure and with reference to FIGS. 2A-2C, each of the metal-insulator-metal corner structures 745 may have a respective horizontal cross-sectional shape selected from a triangular shape and a polygonal shape including a pair of laterally-extending strips 745S extending along two horizontal directions that are perpendicular to each other and connected to each other by a connecting shape (745R or 745T). Generally, each semiconductor die 700 may have a rectangular horizontal cross-sectional shape including a pair of lengthwise sides extending along a first horizontal direction hd1, and a pair of widthwise sides extending along a second horizontal direction hd2 that is perpendicular to the first horizontal direction hd1. Upon dicing of the two-dimensional array of semiconductor dies 700 into discrete semiconductor dies 700 in a subsequent processing step, each semiconductor die 700 may be diced along the four sides of the rectangular horizontal cross-sectional shape. Thus, upon dicing of the semiconductor dies 700, each semiconductor die 700 comprises a pair of lengthwise sidewalls laterally extending along the first horizontal direction hd1 and a pair of widthwise sidewalls laterally extending along the second horizontal direction hd2. In one embodiment, each of the metal-insulator-metal corner structures 745 may have a first straight sidewall that is parallel to the first horizontal direction hd1 and a second straight sidewall that is parallel to the second horizontal direction hd2.

Figure 1C:
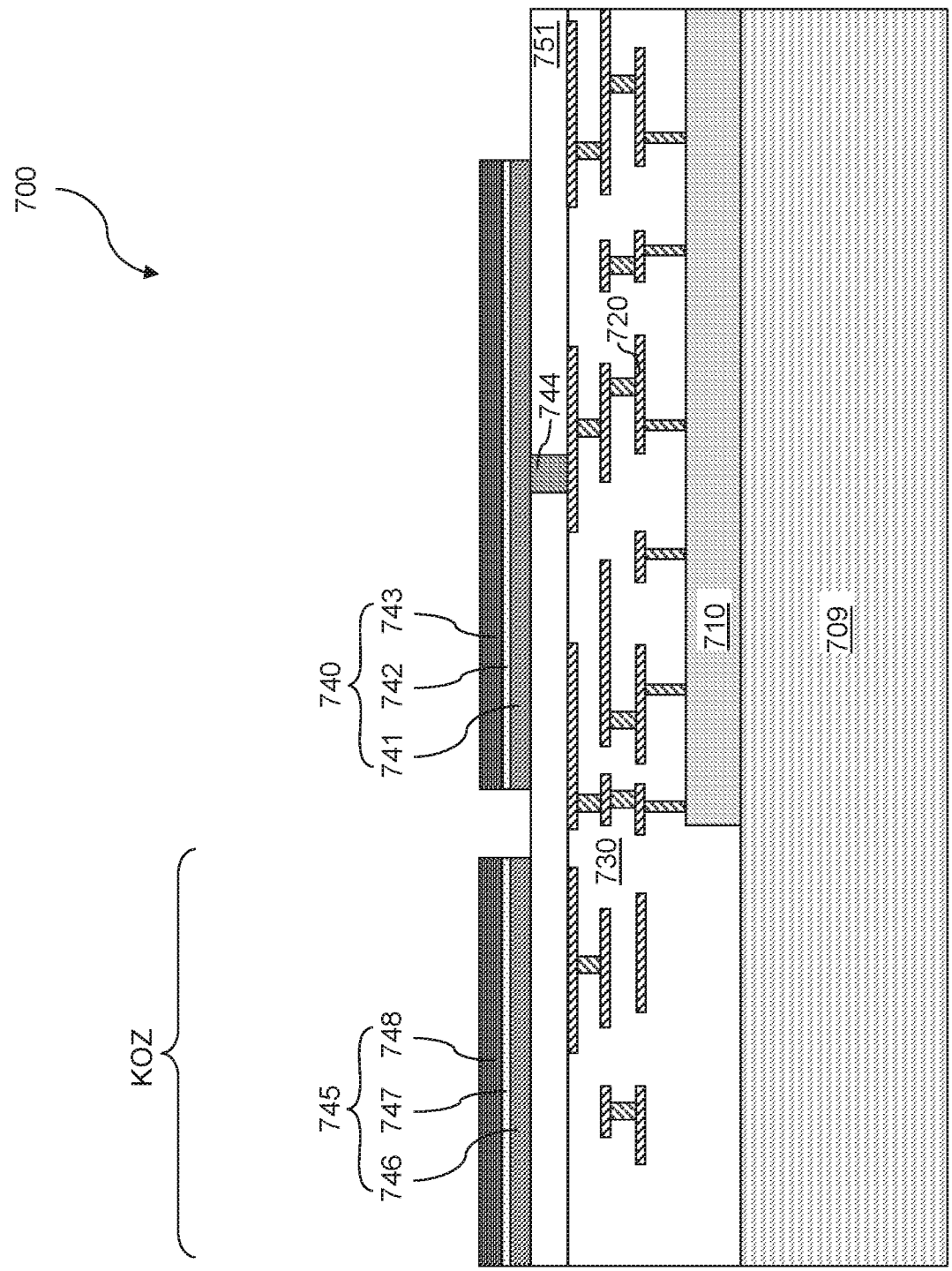
FIG. 1C is a vertical cross-sectional view of the region of the exemplary semiconductor die after patterning the MIM layer stack into MIM capacitors and MIM corner structures according to an embodiment of the present disclosure.

Referring to FIG. 2A, a first configuration of the exemplary semiconductor die 700 of FIG. 1C is illustrated. In the first configuration of the exemplary semiconductor die 700, each of the metal-insulator-metal corner structures 745 may have a horizontal cross-sectional shape that is a triangular shape. In this embodiment, a first side and a second side of the triangular shape may be located within the first straight sidewall SS1 and the second straight sidewall SS2, respectively, of a respective metal-insulator-metal corner structure 745.

In one embodiment, the triangular shape may be a shape of a right isosceles triangle, i.e., a triangle having three angles of 90 degrees, 45 degrees, and 45 degrees. The length of the first side and the length of the second side of the triangular shape may be the same, which is herein referred to as dimension A. The dimension A may be in a range from 2% to 12%, such as from 4% to 8%, of the length of the semiconductor die 700 along the first horizontal direction hd1, and/or in a range from 2% to 12%, such as from 4% to 8%, of the width of the semiconductor die 700 along the second horizontal direction hd2. In an illustrative example, the dimension A may be in a range from 0.4 mm to 2.0 mm, such as from 0.8 mm to 1.2 mm, although lesser and greater dimensions may also be used.

Referring to FIG. 2B, a second configuration of the exemplary semiconductor die 700 of FIG. 1C is illustrated. In the second configuration of the exemplary semiconductor die 700, each of the metal-insulator-metal corner structures 745 may have a horizontal cross-sectional shape that is a polygonal shape including a pair of laterally-extending strips 745S. A first laterally-extending strip 745S within the pair of laterally-extending strips 745S laterally extends along the first horizontal direction hd1, and a second laterally-extending strip 745S within the pair of laterally extending strips 745S laterally extends along the second horizontal direction hd2.

In one embodiment, the polygonal shape includes a connecting shape that connects the pair of laterally-extending strips 745S. In one embodiment, the connecting shape may include a rectangular shape 745R including a side located within the first straight sidewall SS1 of the metal-insulator-metal corner structure 745, and another side located within the second straight sidewall SS2 of the metal-insulator-metal corner structure 745.

In one embodiment, the rectangular connecting shape may be a shape of a square. The length of the first side and the length of the second side of the square shape may be the same, which is herein referred to as dimension A1. The dimension A1 may be in a range from 1% to 10%, such as from 2% to 4% and/or from 3% to 7%, of the length of the semiconductor die 700 along the first horizontal direction hd1, and/or in a range from 1% to 10%, such as from 2% to 4% and/or from 3% to 7%, of the width of the semiconductor die 700 along the second horizontal direction hd2. In an illustrative example, the dimension A1 may be in a range from 0.2 mm to 2.0 mm, such as from 0.4 mm to 1.0 mm, although lesser and greater dimensions may also be used.

Each of the laterally-extending strips 745S laterally extends along a respective lengthwise direction, and has a respective uniform width along a respective widthwise direction. The uniform width along the widthwise direction of each laterally-extending strip 745S is herein referred to as dimension B. The dimension B may be in a range from 0.5% to 4%, such as from 1% to 2%, of the length of the semiconductor die 700 along the first horizontal direction hd1, and/or in a range from 0.5% to 4%, such as from 1% to 2%, of the width of the semiconductor die 700 along the second horizontal direction hd2. In an illustrative example, the dimension B may be in a range from 0.05 mm to 1.0 mm, such as from 0.1 mm to 0.5 mm, although lesser and greater dimensions may also be used.

The length of each laterally-extending strip 745S is herein referred to as dimension A2. The dimension A2 may be in a range from 3% to 25%, such as from 3% to 7% and/or from 4% to 15% and/or from 11% to 22%, of the length of the semiconductor die 700 along the first horizontal direction hd1, and/or in a range from 3% to 25%, such as from 3% to 7% and/or from 4% to 15% and/or from 11% to 22%, of the width of the semiconductor die 700 along the second horizontal direction hd2. In an illustrative example, the dimension A2 may be in a range from 0.3 mm to 8 mm, such as from 0.6 mm to 2 mm and/or from 1 mm to 4 mm and/or from 2 mm to 6 mm, although lesser and greater dimensions may also be used. Each of the metal-insulator-metal corner structures 745 may have a boomerang shape in top view.

Referring to FIG. 2C, a third configuration of the exemplary semiconductor die 700 of FIG. 1C is illustrated. In the third configuration of the exemplary semiconductor die 700, each of the metal-insulator-metal corner structures 745 may have a horizontal cross-sectional shape that is a polygonal shape including a pair of laterally-extending strips 745S. A first laterally-extending strip 745S within the pair of laterally-extending strips 745S laterally extends along the first horizontal direction hd1, and a second laterally-extending strip 745S within the pair of laterally extending strips 745S laterally extends along the second horizontal direction hd2.

In one embodiment, the polygonal shape may include a connecting shape that connects the pair of laterally-extending strips 745S. In one embodiment, the connecting shape comprises a triangular shape 745T including a side located within the first straight sidewall SS1 of the metal-insulator-metal corner structure 745, and another side located within the second straight sidewall SS2 of the metal-insulator-metal corner structure 745. The connecting triangular shape may partially overlap with end portions of each of the laterally-extending strips 745S.

In one embodiment, the triangular shape 745T may be a shape of a right isosceles triangle. The lateral dimension from a right-angle corner of the triangular shape 745T to each of the laterally-extending strips 745S (i.e., to the proximal portion of the horizontal cross-sectional shape having a uniform width of dimension B) may be the same, which is herein referred to as dimension A1. The dimension A1 may be in a range from 1% to 10%, such as from 2% to 4% and/or from 3% to 7%, of the length of the semiconductor die 700 along the first horizontal direction hd1, and/or in a range from 1% to 10%, such as from 2% to 4% and/or from 3% to 7%, of the width of the semiconductor die 700 along the second horizontal direction hd2. In an illustrative example, the dimension A1 may be in a range from 0.2 mm to 2.0 mm, such as from 0.4 mm to 1.0 mm, although lesser and greater dimensions may also be used.

Each of the laterally-extending strips 745S may laterally extend along a respective lengthwise direction, and may have a respective uniform width along a respective widthwise direction. The uniform width along the widthwise direction of each laterally-extending strip 745S is herein referred to as dimension B. The dimension B may be in a range from 0.5% to 4%, such as from 1% to 2%, of the length of the semiconductor die 700 along the first horizontal direction hd1, and/or in a range from 0.5% to 4%, such as from 1% to 2%, of the width of the semiconductor die 700 along the second horizontal direction hd2. In an illustrative example, the dimension B may be in a range from 0.05 mm to 1.0 mm, such as from 0.1 mm to 0.5 mm, although lesser and greater dimensions may also be used.

The length of each laterally-extending strip 745S is herein referred to as dimension A2. The dimension A2 may be in a range from 3% to 25%, such as from 3% to 7% and/or from 4% to 15% and/or from 11% to 22%, of the length of the semiconductor die 700 along the first horizontal direction hd1, and/or in a range from 3% to 25%, such as from 3% to 7% and/or from 4% to 15% and/or from 11% to 22%, of the width of the semiconductor die 700 along the second horizontal direction hd2. In an illustrative example, the dimension A2 may be in a range from 0.3 mm to 8 mm, such as from 0.6 mm to 2 mm and/or from 1 mm to 4 mm and/or from 2 mm to 6 mm, although lesser and greater dimensions may also be used.

Referring collectively to FIGS. 1C and 2A-2C, the metal-insulator-metal corner structures 745 overlie the semiconductor devices 710, and may be located in keep-out zones (KOZ's) (i.e., corner regions) of a respective semiconductor die 700. Each of the metal-insulator-metal corner structures 745 may include a bottom corner plate 746, a dielectric corner plate 747 overlying the bottom corner plate 746, and a top corner plate 748 overlying the dielectric corner plate 747. The area of each of the semiconductor dies 700 may be laterally bounded by a pair of straight vertical planes laterally extending along the first horizontal direction hd1 and a pair of straight vertical planes laterally extending along the second horizontal direction hd2. Each of the metal-insulator-metal corner structures 745 may have a first straight sidewall SS1 that is parallel to the first horizontal direction and a second straight sidewall SS2 that is parallel to the second horizontal direction hd2.

According to an aspect of the present disclosure, each of the metal-insulator-metal corner structures 745 may have a respective variable first lateral extent VLE1 along the first horizontal direction hd1 that decreases stepwise or continuously as a function of a first lateral distance LD1 from the second straight sidewall SS2 along the first horizontal direction hd1, and a respective variable second lateral extent VLE2 along the second horizontal direction hd2 that decreases stepwise or continuously as a function of a second lateral distance LD2 from the first straight sidewall SS1 along the second horizontal direction hd2.

In the embodiment of the first configuration of the exemplary semiconductor die illustrated in FIG. 2A, each of the metal-insulator-metal corner structures 745 may have a respective variable first lateral extent VLE1 along the first horizontal direction hd1 that decreases continuously as a function of a first lateral distance LD1 from the second straight sidewall SS2 along the first horizontal direction hd1, and a respective variable second lateral extent VLE2 along the second horizontal direction hd2 that decreases continuously as a function of a second lateral distance LD2 from the first straight sidewall SS1 along the second horizontal direction hd2.

In the embodiment of the second configuration of the exemplary semiconductor die illustrated in FIG. 2B, each of the metal-insulator-metal corner structures 745 may have a respective variable first lateral extent VLE1 along the first horizontal direction hd1 that decreases stepwise twice as a function of a first lateral distance LD1 from the second straight sidewall SS2 along the first horizontal direction hd1, and a respective variable second lateral extent VLE2 along the second horizontal direction hd2 that decreases stepwise twice as a function of a second lateral distance LD2 from the first straight sidewall SS1 along the second horizontal direction hd2.

In the embodiment of the third configuration of the exemplary semiconductor die illustrated in FIG. 2C, each of the metal-insulator-metal corner structures 745 may have a respective variable first lateral extent VLE1 along the first horizontal direction hd1 that decreases stepwise once and then decreases continuously as a function of a first lateral distance LD1 from the second straight sidewall SS2 along the first horizontal direction hd1, and a respective variable second lateral extent VLE2 along the second horizontal direction hd2 that decreases stepwise once and then decreases continuously as a function of a second lateral distance LD2 from the first straight sidewall SS1 along the second horizontal direction hd2.

Figure 3A:
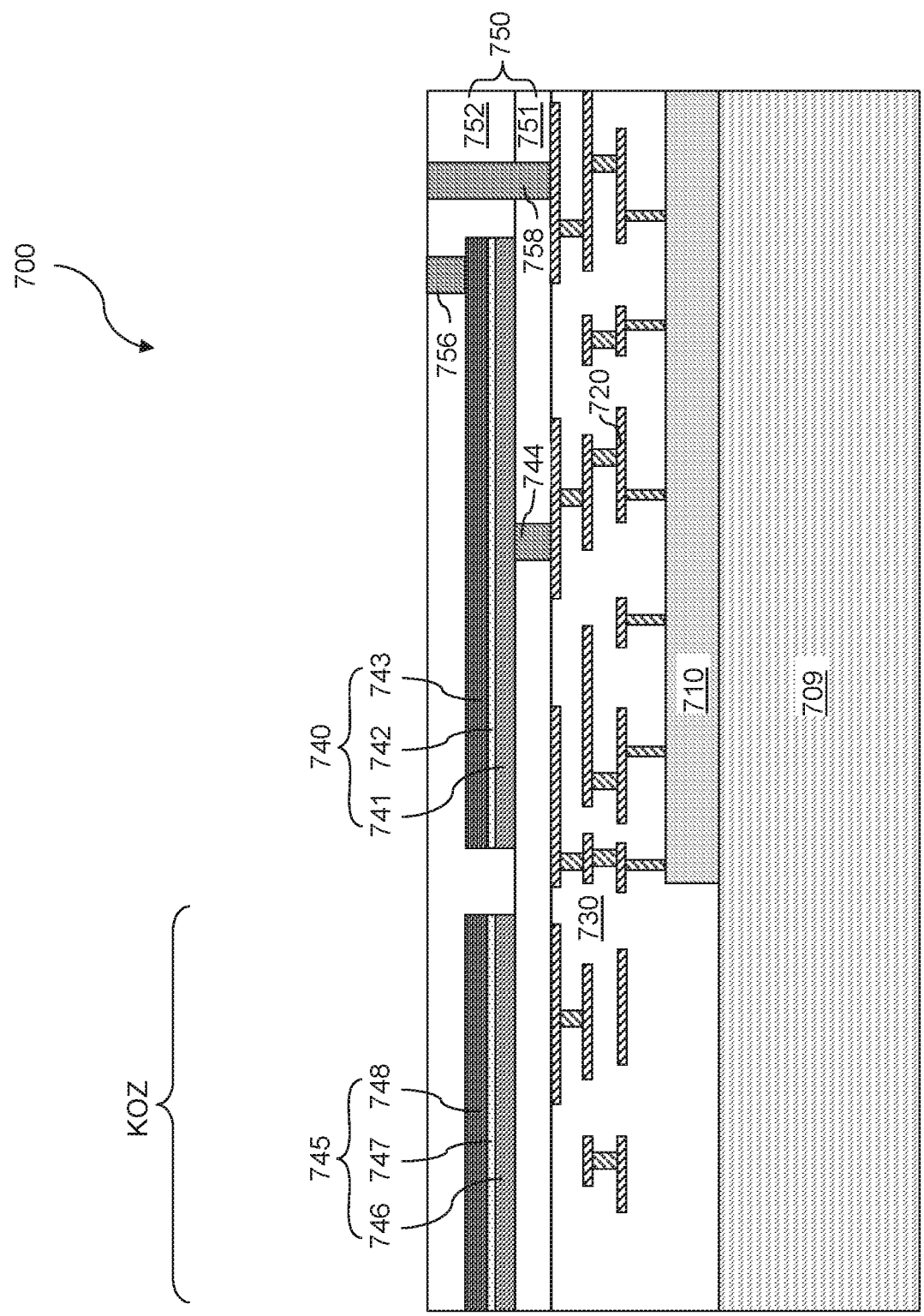
FIG. 3A is a vertical cross-sectional view of the region of the exemplary semiconductor die after formation of an upper passivation layer and upper contact via structures according to an embodiment of the present disclosure.

Referring to FIG. 3A, an upper passivation layer 752 may be formed over the metal-insulator-metal corner structures 745 and the at least one metal-insulator-metal capacitor structure 740. The upper passivation layer 752 may include a dielectric passivation material that may block diffusion of impurity atoms such as hydrogen atoms, oxygen atoms, fluorine atoms, carbon atoms, and metal atoms. For example, the upper passivation layer 752 may comprise polyimide, silicon nitride or silicon carbide nitride. The dielectric passivation material of the upper passivation layer 752 may be the same as, or may be different from, the dielectric passivation material of the lower passivation layer 751. The thickness of the upper passivation layer 752 may be in a range from 50 nm to 500 nm, although lesser and greater thicknesses may also be used. The combination of the lower passivation layer 751 and the upper passivation layer 752 is collectively referred to as passivation layers 750.

Each metal-insulator-metal capacitor structure 740 and each metal-insulator-metal corner structure 745 may be embedded within the passivation layers 750. A top electrode contact via structure 756 may be formed through the upper passivation layer 752 directly on a top surface of each top capacitor plate 743. Optionally, a top electrode connection via structure 758 may be formed through the passivation layers 750 adjacent to each metal-insulator-metal capacitor structure 740 directly on one of the metal interconnect structures 720 embedded within the dielectric material layers 730. Each bottom electrode contact via structure 744 may contact a bottom surface of a respective bottom capacitor plate 741.

In one embodiment, the lower passivation layer 751 underlies the metal-insulator-metal corner structures 745 and overlies the semiconductor devices 710, and the upper passivation layer 752 overlies the metal-insulator-metal corner structures 745 and contacts portions of a top surface of the lower passivation layer 751. The bottom corner plate 746 and the top corner plate 748 of each of the metal-insulator-metal corner structures 745 may be electrically isolated from the semiconductor devices 710.

Figure 3B:
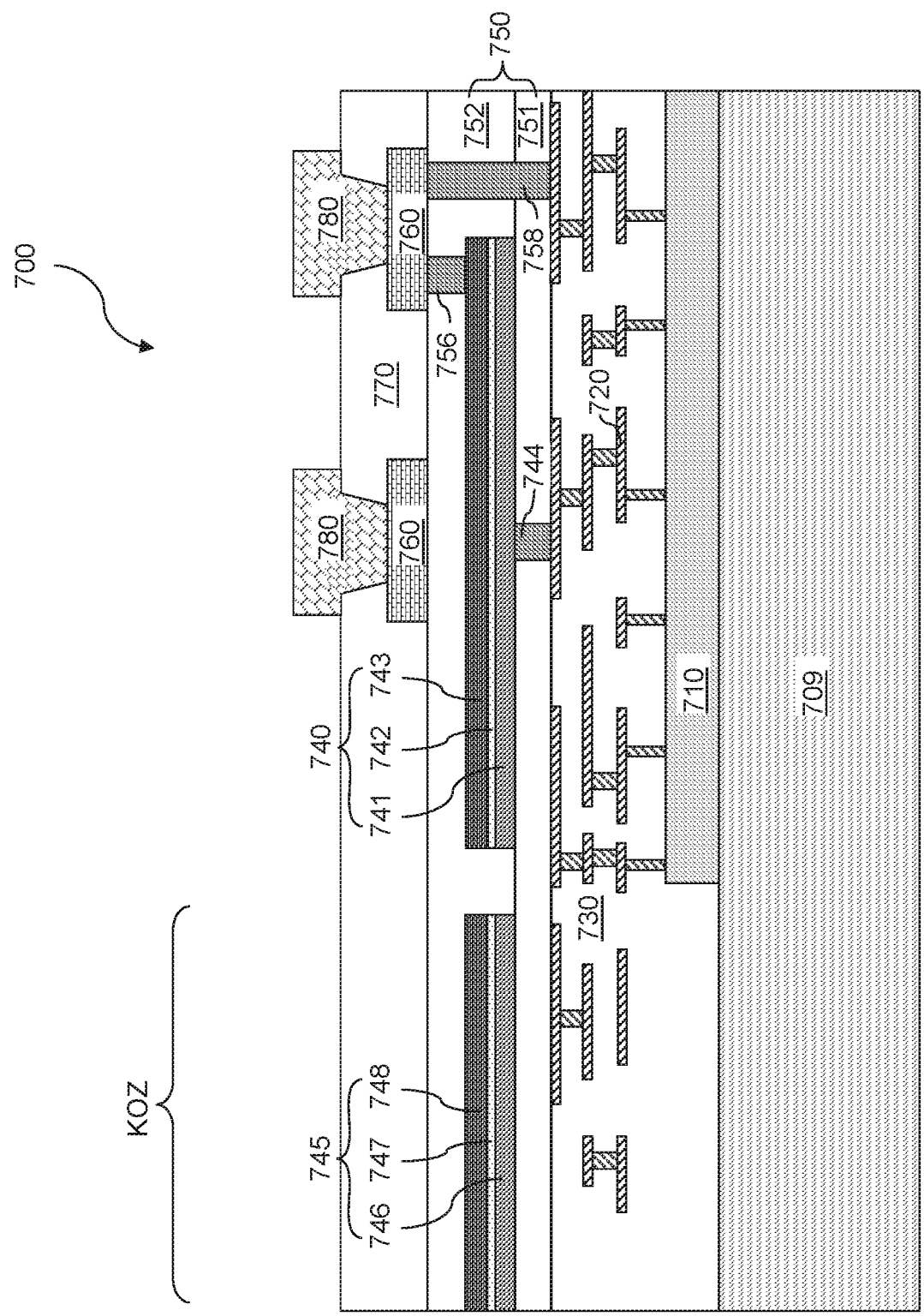
FIG. 3B is a vertical cross-sectional view of the region of the exemplary structure after formation of die-side bonding structures according to an embodiment of the present disclosure.

Referring to FIG. 3B, top-level metal interconnect structures 760 may be formed by depositing and patterning a conductive material. For example, a metal layer such as an aluminum layer or a copper layer may be deposited over the top surface of the upper passivation layer 752. Other suitable conductive materials are within the contemplated scope of disclosure. A photoresist layer (not shown) may be applied over the metal layer, and may be patterned into discrete photoresist material portions. An etch process, such as an anisotropic etch process or an isotropic etch process may be performed to transfer the pattern in the discrete photoresist material portions through the conductive metal material layer. The photoresist material portions may be subsequently removed, for example, by ashing. Patterned portions of the metal layer may include the top-level metal interconnect structures 760. The top-level metal interconnect structures 760 may be formed in areas in which die-side bonding structures may be subsequently formed. Thus, the top-level metal interconnect structures 760 may be formed outside the areas of the keep-out zones (KOZ's). In some embodiments, one of more of the top-level metal interconnect structures 760 may contact a top electrode contact via structure 756 and a top electrode connection via structure 758, thereby functioning as an electrically conductive path for electrically connecting a top capacitor plate 743 to one of the semiconductor devices 710 or to a die-side bonding structure to be subsequently formed. The thickness of the top-level metal interconnect structures 760 may be in a range from 200 nm to 1,000 nm, although lesser and greater thicknesses may also be used.

A capping passivation layer 770 may be formed over the top-level metal interconnect structures 760. The capping passivation layer 770 may include a dielectric passivation material that may block diffusion of impurity atoms such as hydrogen atoms, oxygen atoms, fluorine atoms, carbon atoms, and metal atoms. For example, the capping passivation layer 770 may include silicon nitride or silicon carbide nitride. The dielectric passivation material of the capping passivation layer 770 may be the same as, or may be different from, the dielectric passivation material of the upper passivation layer 752 and/or the dielectric passivation material of the lower passivation layer 751. The thickness of the capping passivation layer 770 may be in a range from 50 nm to 500 nm, although lesser and greater thicknesses may also be used.

Openings may be formed through the capping passivation layer 770, for example, by applying a photoresist layer over the capping passivation layer 770 and by forming discrete openings in the photoresist layer in areas overlying the top-level metal interconnect structures 760. An anisotropic etch process may be performed to form via cavities extending through the capping passivation layer 770. A top surface of a top-level metal interconnect structure 760 may be physically exposed at the bottom of each via cavity. The photoresist layer may be subsequently removed.

A metallic liner material such as TiN or TaN may be deposited into the via cavities and over the capping passivation layer 770 to form a metallic liner. A photoresist layer (not shown) may be applied over the metallic liner, and may be lithographically patterned to form openings in areas overlying or surrounding the via cavities. Additional metallic materials may be deposited into the openings in the photoresist layer. The additional metallic materials may comprise any combination of materials that may be used as an underbump metallurgy (UBM) stack as known in the art. The additional metallic materials may be deposited by electroplating and/or physical vapor deposition. The photoresist layer may be subsequently lifted off with any metallic material portions thereabove, if any. Physically exposed portions of the metallic liner may be subsequently removed selective to the capping passivation layer 770, for example, by an isotropic etch process. Remaining portions of the metallic liner and the additional metallic materials constitute die-side bonding structures 780. The die-side bonding structures 780 may be formed by alternative formation methods as known in the art. The die-side bonding structures 780 may be formed outside the areas of the keep-out zones (KOZ's).

In one embodiment, the bottom corner plate 746 and the top corner plate 748 of each of the metal-insulator-metal corner structures 745 may be electrically isolated from the semiconductor devices 710, and may be electrically isolated from the die-side bonding structures 780. As such, each bottom corner plate 746 and each top corner plate 748 may be electrically floating.

Subsequently, the two-dimensional array of semiconductor dies 700 may be diced along dicing channels that are parallel to the first horizontal direction hd1 or the second horizontal direction hd2. Each of the semiconductor dies 700 may be diced by cutting through material portions located over the semiconductor substrate 709 and through the semiconductor substrate 709.

In one embodiment, each semiconductor die 700 as diced may include a pair of lengthwise sidewalls laterally extending along the first horizontal direction hd1 and a pair of widthwise sidewalls laterally extending along the second horizontal direction hd2. In one embodiment, each of the metal-insulator-metal corner structures 745 may include a first straight sidewall SS1 that is parallel to the first horizontal direction hd1 and a second straight sidewall SS2 that is parallel to the second horizontal direction hd2. In some embodiments, the first straight sidewalls SS1 and the second straight sidewalls SS2 of the metal-insulator-metal corner structures 745 may be physically exposed upon dicing, i.e., may be segments of sidewalls of the diced semiconductor die 700.

In one embodiment, the horizontal cross-sectional shape of each metal-insulator-metal corner structure 745 may be a triangular shape (for example, as illustrated in FIG. 2A), and a first side and a second side of the triangular shape may be located within the first straight sidewall SS1 of the semiconductor die 700 and the second straight sidewall SS2, respectively.

In one embodiment, the horizontal cross-sectional shape of each metal-insulator-metal corner structure 745 may be a polygonal shape (for example, as illustrated in FIGS. 2B and 2C) and may include a pair of laterally-extending strips 745S and a connecting shape that connects the pair of laterally-extending strips 745S. Each of the laterally-extending strips 745S may have a respective uniform width along a respective widthwise direction. In one embodiment, the connecting shape may include a rectangular shape or a triangular shape including a side located within the first straight sidewall SS1 and another side located within the second straight sidewall SS2.

Figure 4A:
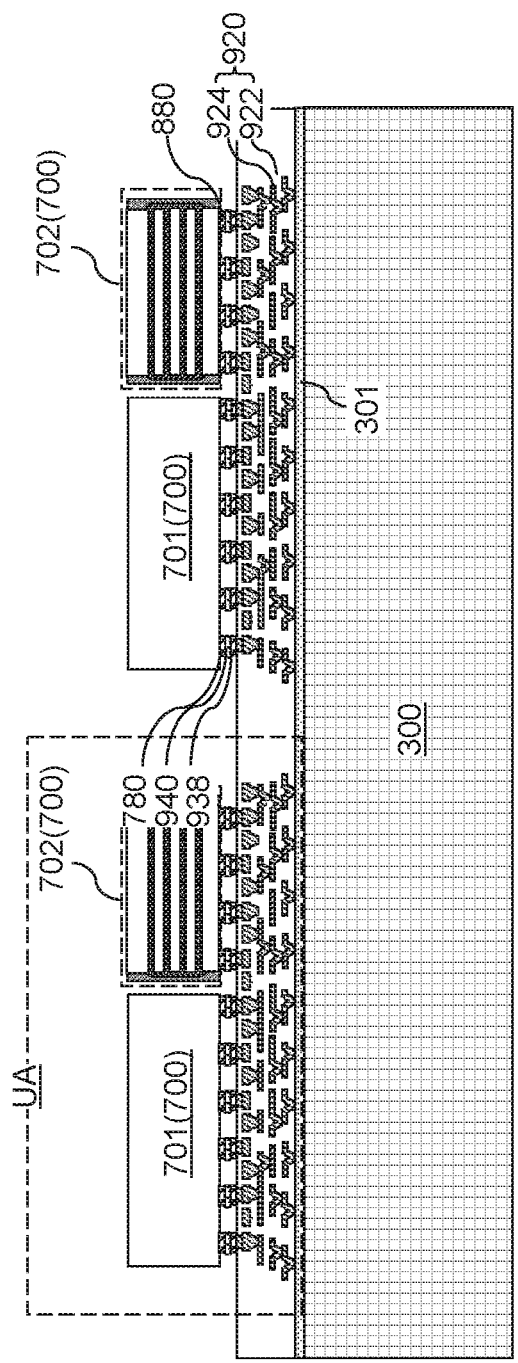
FIG. 4A is a vertical cross-sectional view of a region the exemplary structure after attaching semiconductor dies to redistribution structures according to an embodiment of the present disclosure.
Figure 4B:
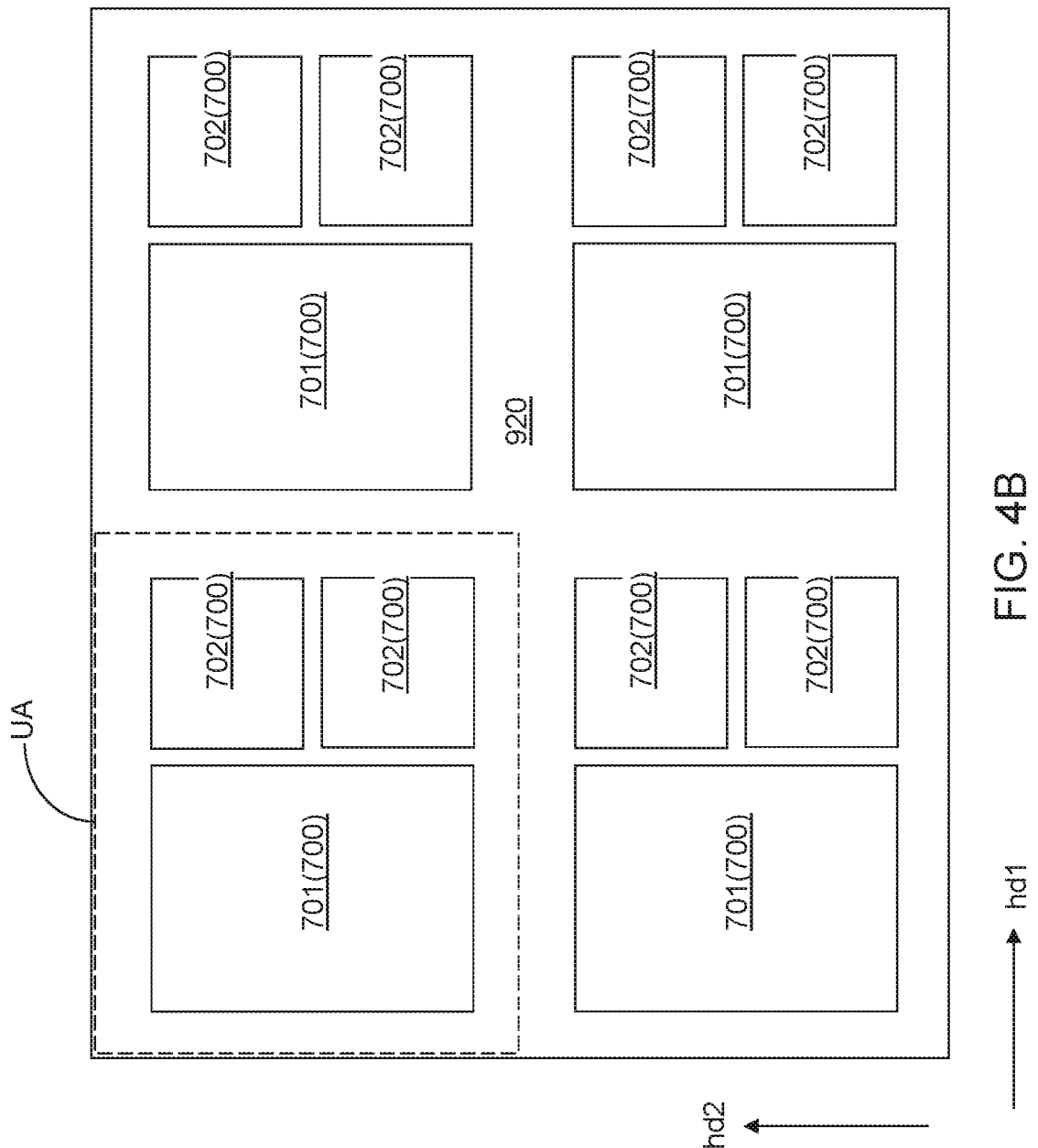
FIG. 4B is a top-down view of the region of the exemplary structure of FIG. 4A.

Referring to FIGS. 4A and 4B, a first carrier substrate 300 including a two-dimensional array of redistribution structures 920 may be provided. The two-dimensional array of redistribution structures 920 may be attached to the first carrier substrate 300 by a first adhesive layer 301. Each redistribution structure 920 may include redistribution dielectric layers 922, redistribution wiring interconnects 924 embedded in the redistribution dielectric layers 922, and redistribution-side bonding structures 938.

A set of at least one semiconductor die (701, 702) may be bonded to each redistribution structure 920. According to an aspect of the present disclosure, one, or more, or each, of the at least one semiconductor die (701, 702) may have the configuration of the exemplary semiconductor die 700 described with reference to FIGS. 1A-1C, 2A-2C, and 3A and 3B. In other words, one, or more, or each, of the at least one semiconductor die (701, 702) may be a semiconductor die that may include: semiconductor devices 710 located on a semiconductor substrate 709; and metal-insulator-metal corner structures 745 overlying the semiconductor devices 710 and located in keep-out zones (KOZ's) (i.e., corner regions) of the semiconductor die 700, wherein: each of the metal-insulator-metal corner structures 745 may include a bottom corner plate 746, a dielectric corner plate 747 overlying the bottom corner plate 746, and a top corner plate 748 overlying the dielectric corner plate 747; and each of the metal-insulator-metal corner structures 745 may have a horizontal cross-sectional shape selected from a triangular shape and a polygonal shape including a pair of laterally-extending strips 745S extending along two horizontal directions (hd1, hd2) that are perpendicular to each other and connected to each other by a connecting shape (745R or 745T).

In one embodiment, the semiconductor die may also include a metal-insulator-metal capacitor structure 740 that includes a bottom capacitor plate 741, a node dielectric layer 742, and a top capacitor plate 743, and located at a same vertical distance from the semiconductor substrate 709 as the metal-insulator-metal corner structures 745 may be from the semiconductor substrate 709. In one embodiment, the semiconductor die 700 may also include metal interconnect structures 720 that may be electrically connected to the semiconductor devices 710 and located within dielectric material layers and interposed between the semiconductor devices 710 and a horizontal plane including bottom surfaces of the metal-insulator-metal corner structures 745 and the metal-insulator-metal capacitor structure 740. In one embodiment, the bottom corner plate 746 may include a same material and may have a same thickness as the bottom capacitor plate 741; the dielectric corner plate 747 may include a same material and may have a same thickness as the node dielectric layer 742L; and the top corner plate 748 may include a same material and may have a same thickness as the top capacitor plate 743. In one embodiment, the semiconductor die 700 may include a pair of lengthwise sidewalls laterally extending along a first horizontal direction and a pair of widthwise sidewalls laterally extending along a second horizontal direction; and each of the metal-insulator-metal corner structures 745 may have a first straight sidewall that may be parallel to the first horizontal direction and a second straight sidewall that is parallel to the second horizontal direction. In one embodiment, the horizontal cross-sectional shape is the triangular shape; and a first side and a second side of the triangular shape are located within the first straight sidewall and the second straight sidewall, respectively. In one embodiment, the horizontal cross-sectional shape is the polygonal shape including the pair of laterally-extending strips; each of the laterally-extending strips has a respective uniform width along a respective widthwise direction; and the connecting shape (745R or 745T) may include a rectangular shape including a side located within the first straight sidewall and another side located within the second straight sidewall. In one embodiment, the horizontal cross-sectional shape is the polygonal shape including the pair of laterally-extending strips; each of the laterally-extending strips may have a respective uniform width along a respective widthwise direction; and the connecting shape (745R or 745T) may include a triangular shape including a side located within the first straight sidewall and another side located within the second straight sidewall. In one embodiment, the semiconductor die 700 may also include: a lower passivation layer 751 underlying the metal-insulator-metal corner structures 745 and overlying the semiconductor devices 710; and an upper passivation layer 752 overlying the metal-insulator-metal corner structures 745 and contacting portions of a top surface of the lower passivation layer 751, wherein the bottom corner plate 746 and the top corner plate 747 of each of the metal-insulator-metal corner structures 745 may be electrically isolated from the semiconductor devices 710.

In some embodiments, one, or more, or each, of the at least one semiconductor die (701, 702) may be a respective semiconductor die that comprises: semiconductor devices 710 located on a semiconductor substrate 709; metal-insulator-metal corner structures 745 overlying the semiconductor devices 710 and located in keep-out zones (KOZ's) of the semiconductor die 700, wherein each of the metal-insulator-metal corner structures 745 may include: a bottom corner plate 746, a dielectric corner plate 747 overlying the bottom corner plate 746, and a top corner plate 748 overlying the dielectric corner plate 747; the semiconductor die 700 may include a pair of lengthwise sidewalls laterally extending along a first horizontal direction hd1 and a pair of widthwise sidewalls laterally extending along a second horizontal direction hd2; each of the metal-insulator-metal corner structures 745 may have a first straight sidewall SS1 that is parallel to the first horizontal direction hd1 and a second straight sidewall SS2 that is parallel to the second horizontal direction hd2; and each of the metal-insulator-metal corner structures 745 may have a respective variable first lateral extent VLE1 along the first horizontal direction hd1 that decreases stepwise or continuously as a function of a first lateral distance LD1 from the second straight sidewall SS2 along the first horizontal direction hd1, and a respective variable second lateral extent VLE2 along the second horizontal direction hd2 that decreases stepwise or continuously as a function of a second lateral distance LD2 from the first straight sidewall SS1 along the second horizontal direction hd2.

In one embodiment, the semiconductor die 700 may also include: a metal-insulator-metal capacitor structure 745 that may include a bottom capacitor plate 746, a top capacitor plate 747, and a top corner plate 748, and located at a same vertical distance from the semiconductor substrate 709 as the metal-insulator-metal corner structures 740 may be set from the semiconductor substrate 709. In one embodiment, the semiconductor die 700 may also include metal interconnect structures 720 electrically connected to the semiconductor devices 710 and located within dielectric material layers and interposed between the semiconductor devices 710 and a horizontal plane including bottom surfaces of the metal-insulator-metal corner structures 745 and the metal-insulator-metal capacitor structure 740. In an embodiment, each of the metal-insulator-metal corner structures 745 may include a horizontal cross-sectional shape that is a triangular shape; and a first side and a second side of the triangular shape may be located within the first straight sidewall and the second straight sidewall, respectively, of a respective one of the metal-insulator-metal corner structures 745. In an embodiment, each of the metal-insulator-metal corner 745 may include a horizontal cross-sectional shape that is polygonal shape including a pair of laterally-extending strips; each of the laterally-extending strips has a respective uniform width along a respective widthwise direction, and is connected to each other by a rectangular connecting shape; and the rectangular connecting shape comprises a side located within the first straight sidewall of a respective one of the metal-insulator-metal corner structures and another side located within the second straight sidewall of the respective one of the metal-insulator-metal corner structures 745. In an embodiment, each of the metal-insulator-metal corner structures 745 may include a horizontal cross-sectional shape that is polygonal shape including a pair of laterally-extending strips; each of the laterally-extending strips may have a respective uniform width along a respective widthwise direction, and is connected to each other by a triangular connecting shape; and the triangular connecting shape comprises a side located within the first straight sidewall of a respective one of the metal-insulator-metal corner structures and another side located within the second straight sidewall of the respective one of the metal-insulator-metal corner structures.

Referring back to FIGS. 4A and 4B, the redistribution structures 920 may be arranged as a two-dimensional periodic array, and multiple sets of at least one semiconductor die (701, 702) may be bonded to the redistribution structures 920 as a two-dimensional periodic rectangular array of sets of the at least one semiconductor die (701, 702). Each set of at least one semiconductor die (701, 702) includes at least one semiconductor die. Each set of at least one semiconductor die (701, 702) may include any set of at least one semiconductor die known in the art. In one embodiment, each set of at least one semiconductor die (701, 702) may comprise a plurality of semiconductor dies (701, 702). For example, each set of at least one semiconductor die (701, 702) may include at least one system-on-chip (SoC) die 701 and/or at least one memory die 702. Each SoC die 701 may comprise an application processor die, a central processing unit die, or a graphic processing unit die. In one embodiment, the at least one memory die 702 may comprise a high bandwidth memory (HBM) die that includes a vertical stack of static random access memory dies. In one embodiment, the at least one semiconductor die (701, 702) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Each semiconductor die (701, 702) may include a respective array of die-side bonding structures (780, 880). For example, each SoC die 701 may include an array of SoC metal bonding structures 780, and each memory die 702 may include an array of memory-die metal bonding structures 880. Each of the semiconductor dies (701, 702) may be positioned in a face-down position such that die-side bonding structures (780, 880) face the first solder material portions 940. Each set of at least one semiconductor die (701, 702) may be placed within a respective unit area UA. Placement of the semiconductor dies (701, 702) may be performed using a pick and place apparatus such that each of the die-side bonding structures (780, 880) may be placed on a top surface of a respective one of the first solder material portions 940.

Generally, a redistribution structure 920 including redistribution-side bonding structures 938 thereupon may be provided, and at least one semiconductor die (701, 702) including a respective set of die-side bonding structures (780, 880) may be provided. The at least one semiconductor die (701, 702) may be bonded to the redistribution structure 920 using first solder material portions 940 that are bonded to a respective redistribution-side bonding structure 938 and to a respective one of the die-side bonding structures (780, 880). Each set of at least one semiconductor die (701, 702) may be attached to a respective redistribution structure 920 through a respective set of first solder material portions 940. Each of the at least one cushioning film within a unit area UA may be located outside an area including the at least one semiconductor die (701, 702) in the unit area UA in a plan view. The plan view is a view along a vertical direction, which is the direction that is perpendicular to the planar top surface of the redistribution structure layer.

Figure 5:
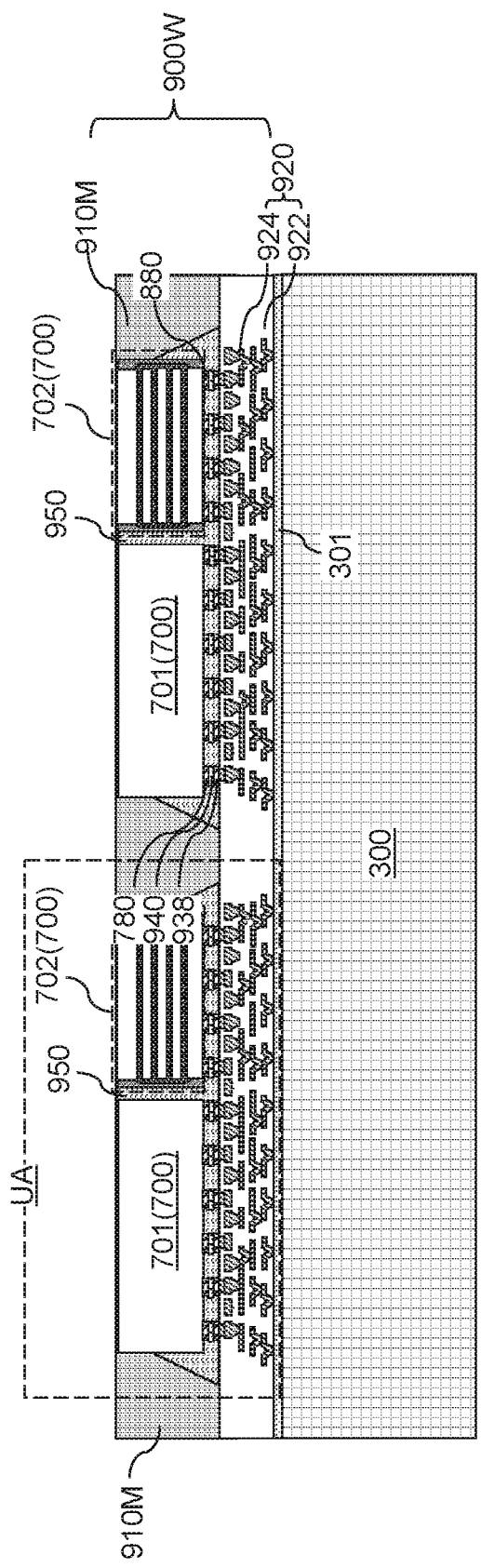
FIG. 5 is a vertical cross-sectional view of a region of the exemplary structure after formation of an epoxy molding compound (EMC) matrix according to an embodiment of the present disclosure.

Referring to FIG. 5, a first underfill material may be applied into each gap between the redistribution structures 920 and sets of at least one semiconductor die (701, 702) that are bonded to the redistribution structures 920. Within each unit area UA, a first underfill material portion 950 may laterally surround, and contact, each of the first solder material portions 940 within the unit area UA. The first underfill material portion 950 may be formed around, and contact, the first solder material portions 940, the redistribution-side bonding structures 938, and the die-side bonding structures (780, 880) in the unit area UA.

Each redistribution structure 920 in a unit area UA comprises redistribution-side bonding structures 938. At least one semiconductor die (701, 702) may include a respective set of die-side bonding structures (780, 880) is attached to the redistribution-side bonding structures 938 through a respective set of first solder material portions 940 within each unit area UA. Within each unit area UA, a first underfill material portion 950 may laterally surround the redistribution-side bonding structures 938 and the die-side bonding structures (780, 880) of the at least one semiconductor die (701, 702).

An epoxy molding compound (EMC) may be applied to the gaps between contiguous assemblies of a respective set of semiconductor dies (701, 702) and a first underfill material portion 950. The EMC may include epoxy resin, hardener, silica (as a filler material), and other additives. The EMC may be provided in a liquid form or in a solid form depending on the viscosity and flowability. The EMC may be cured at a curing temperature to form an EMC matrix 910M that laterally surrounds and embeds each assembly of a set of semiconductor dies (701, 702) and a first underfill material portion 950. The EMC matrix 910M includes a plurality of epoxy molding compound (EMC) die frames that may be laterally adjoined to one another. Each EMC die frame may be a portion of the EMC matrix 910M that is located within a respective unit area UA. Thus, each EMC die frame laterally surrounds and embeds a respective a set of semiconductor dies (701, 702) and a respective first underfill material portion 950.

Portions of the EMC matrix 910M that overlie the horizontal plane including the top surfaces of the semiconductor dies (701, 702) may be removed by a planarization process. For example, the portions of the EMC matrix 910M that overlie the horizontal plane may be removed using a chemical mechanical planarization (CMP). The combination of the remaining portion of the EMC matrix 910M, the semiconductor dies (701, 702), the first underfill material portions 950, and the two-dimensional array of redistribution structures 920 comprises a reconstituted wafer 900W. Each portion of the EMC matrix 910M located within a unit area UA constitutes an EMC die frame.

Figure 6:
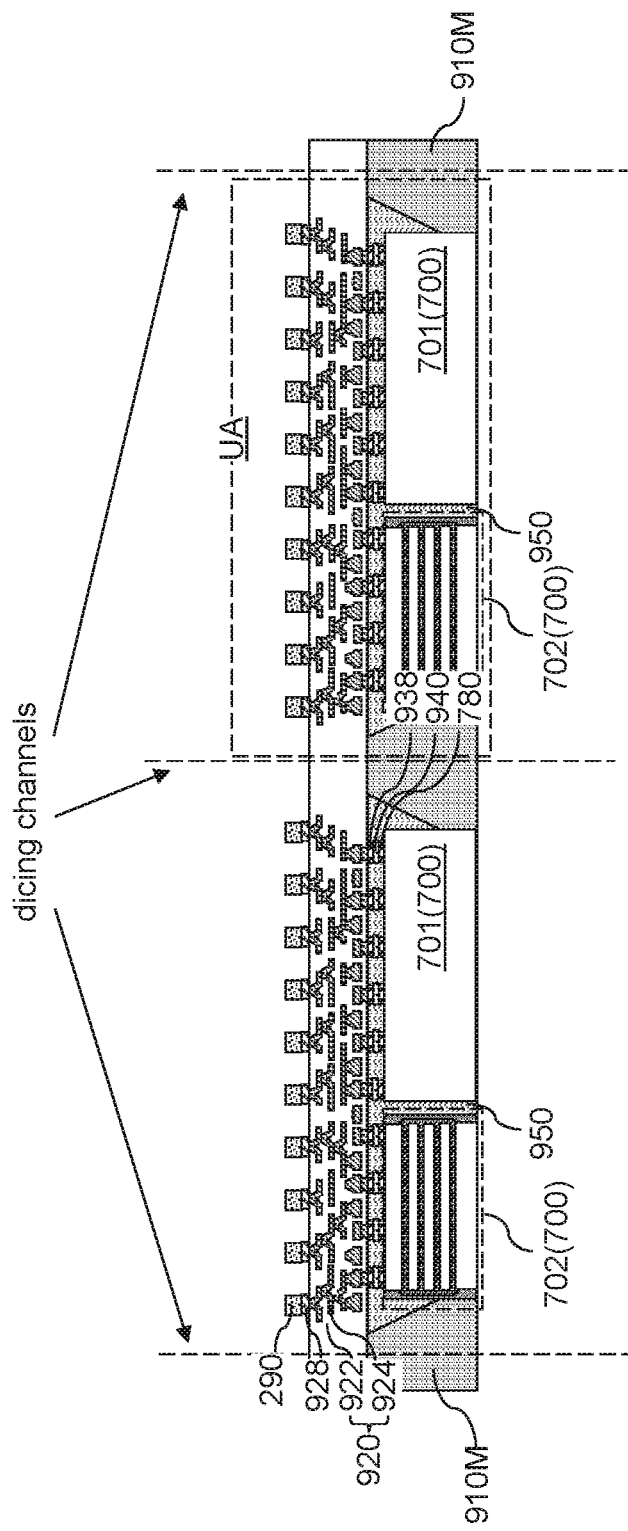
FIG. 6 is a vertical cross-sectional view of a region of the exemplary structure during dicing of a redistribution substrate and the EMC matrix according to an embodiment of the present disclosure.

Referring to FIG. 6, a second adhesive layer (not shown) may be applied to the physically exposed planar surface of the reconstituted wafer 900W, i.e., the physically exposed surfaces of the EMC matrix 910M, the semiconductor dies (701, 702), and the first underfill material portions 950. A second carrier substrate (not shown) may be attached to the second adhesive layer. The second carrier substrate may be attached to the opposite side of the reconstituted wafer 900W relative to the first carrier substrate 300. The first adhesive layer 301 may be decomposed by ultraviolet radiation or by a thermal anneal at a debonding temperature. In embodiments in which the first carrier substrate 300 includes an optically transparent material and the first adhesive layer 301 includes an Light To Heat Conversion (LTHC) coating material layer, the first adhesive layer 301 may be decomposed by irradiating ultraviolet light through the transparent carrier substrate.

Fan-out bonding pads 928 and second solder material portions 290 may be formed by depositing and patterning a stack of at least one metallic material that may function as metallic bumps and a solder material layer. The metallic fill material for the fan-out bonding pads 928 may include copper. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The fan-out bonding pads 928 and the second solder material portions 290 may be formed on the opposite side of the EMC matrix 910M and the two-dimensional array of sets of semiconductor dies (701, 702) relative to the redistribution structure layer. The redistribution structure layer may include a three-dimensional array of redistribution structures 920. Each redistribution structure 920 may be located within a respective unit area UA.

Each redistribution structure 920 may include redistribution dielectric layers 922, redistribution wiring interconnects 924 embedded in the redistribution dielectric layers 922, and fan-out bonding pads 928. The fan-out bonding pads 928 may be located on an opposite side of the redistribution-side bonding structures 938 relative to the redistribution dielectric layers 922, and may be electrically connected to a respective one of the redistribution-side bonding structures 938. The second adhesive layer may be decomposed by ultraviolet radiation or by a thermal anneal at a debonding temperature. The second carrier substrate (not shown) may be detached from the reconstituted wafer 900W.

The reconstituted wafer 900W including the fan-out bonding pads 928 may be subsequently diced along dicing channels by performing a dicing process. The dicing channels correspond to the boundaries between neighboring pairs of die areas (DA). Each diced unit from the reconstituted wafer 900W may include a fan-out package 900. In other words, each diced portion of the assembly of the two-dimensional array of sets of semiconductor dies (701, 702), the two-dimensional array of first underfill material portions 950, the EMC matrix 910M, and the two-dimensional array of redistribution structures 920 constitutes a fan-out package 900. Each diced portion of the EMC matrix 910M constitutes a molding compound die frame 910. Each diced portion of the redistribution structure layer (which includes the two-dimensional array of redistribution structures 920) constitutes a redistribution structure 920.

Figure 7:
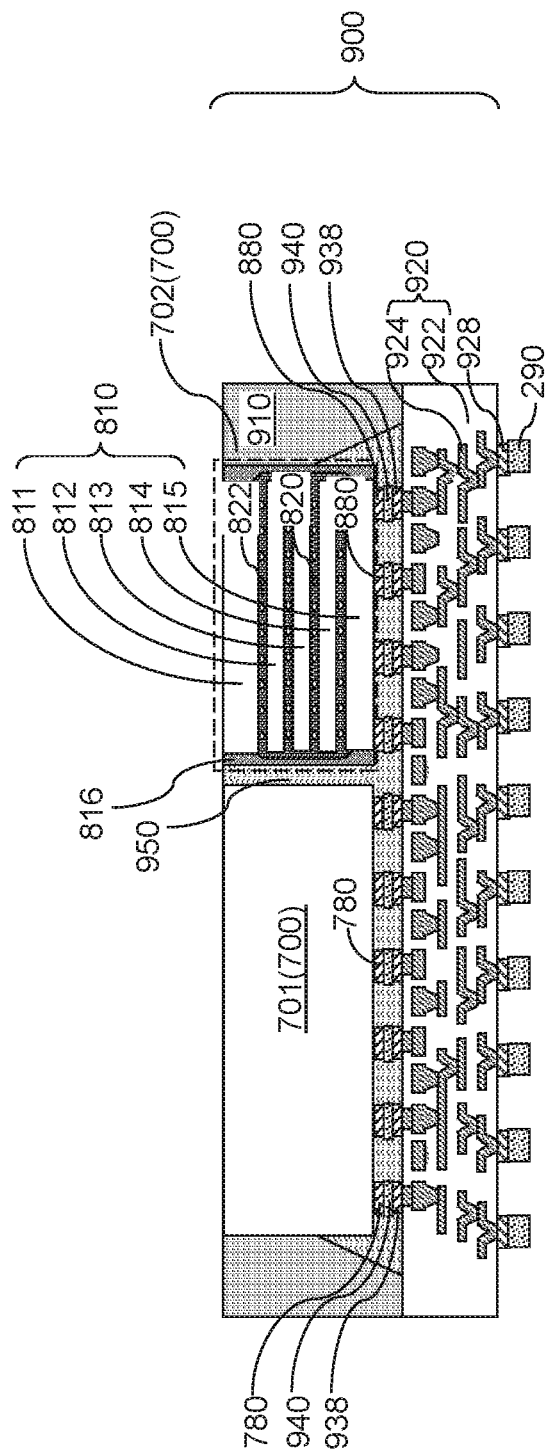
FIG. 7 is a vertical cross-sectional view of an exemplary structure including a fan-out package according to an embodiment of the present disclosure.

Referring to FIG. 7, a fan-out package 900 obtained by dicing the exemplary structure at the processing steps of FIG. 6 is illustrated. The fan-out package 900 may include a redistribution structure 920 that includes redistribution-side bonding structures 938, at least one semiconductor die (701, 702) that may include a respective set of die-side bonding structures (780, 880) that is attached to the redistribution-side bonding structures 938 through a respective set of first solder material portions 940, a first underfill material portion 950 laterally surrounding the redistribution-side bonding structures 938 and the die-side bonding structures (780, 880) of the at least one semiconductor die (701, 702).

The fan-out package 900 may include a molding compound die frame 910 laterally surrounding the at least one semiconductor die (701, 702) and may also include a molding compound material. In one embodiment, the molding compound die frame 910 may include sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die (701, 702) after formation of the first underfill material portion 950 within each fan-out package 900. The molding compound material contacts a peripheral portion of a planar surface of the redistribution structure 920.

Figure 8:
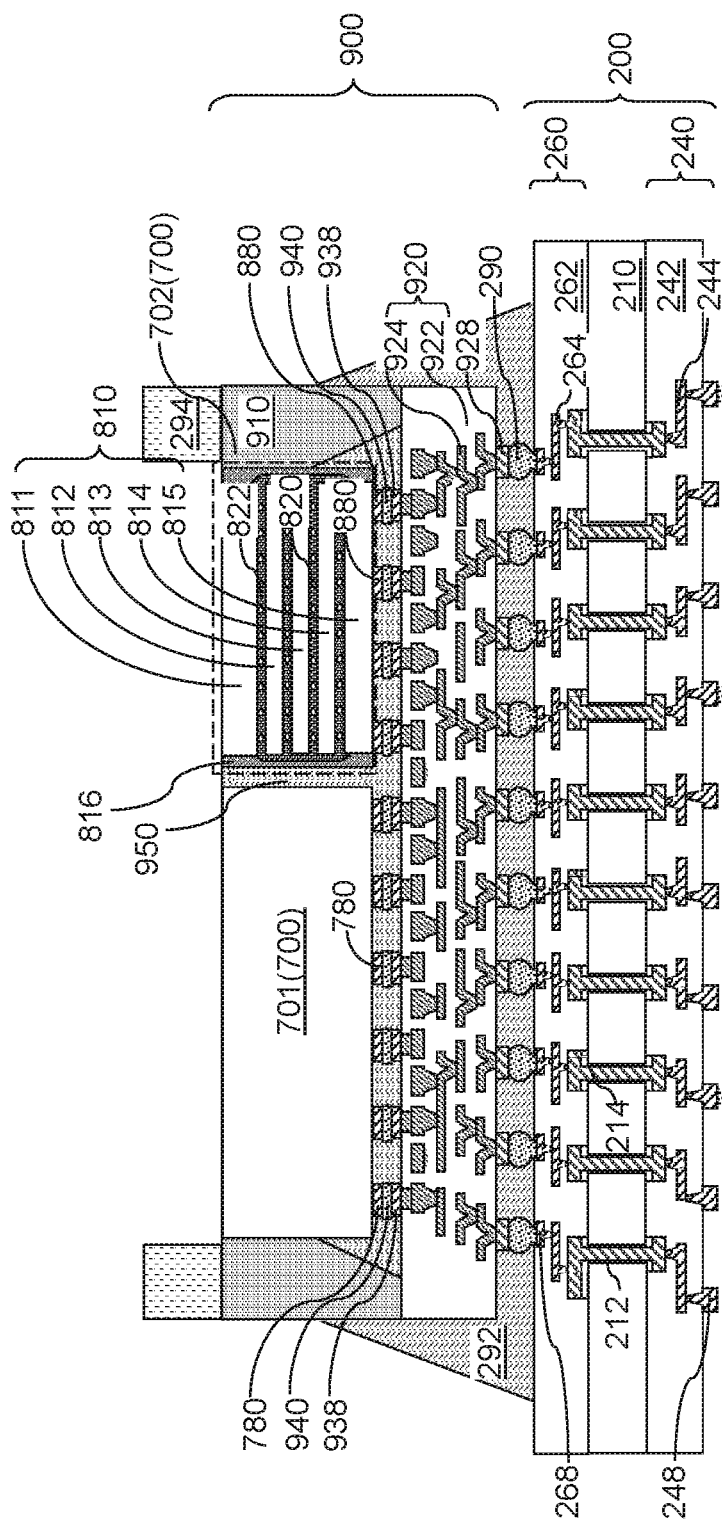
FIG. 8 is a vertical cross-sectional view of an exemplary structure after attaching the fan-out package to the packaging substrate according to an embodiment of the present disclosure.

Referring to FIG. 8, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 may include a chip-side surface laminar circuit 260 that includes chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 may be configured to allow bonding through solder balls. The array of chip-side bonding pads 268 may be configured to allow bonding through C4 solder balls. Generally, any type of packaging substrate 200 may be used.

The fan-out package 900 may be disposed over the packaging substrate 200 with an array of the second solder material portions 290 therebetween. In embodiments in which the second solder material portions 290 may be formed on the fan-out bonding pads 928 of the fan-out package 900, the second solder material portions 290 may be disposed on the chip-side bonding pads 268 of the packaging substrate 200. A reflow process may be performed to reflow the second solder material portions 290, thereby inducing bonding between the fan-out package 900 and the packaging substrate 200. Each second solder material portion 290 may be bonded to a respective one of the fan-out bonding pads 928 and to a respective one of the chip-side bonding pads 268. Generally, the fan-out package 900 may be bonded to the packaging substrate 200 such that the redistribution structure 920 is bonded to the packaging substrate 200 by an array of solder material portions (such as the second solder material portions 290).

In the illustrated example, a high bandwidth memory (HBM) die 810 is illustrated as a semiconductor die 702. The HBM die 810 includes a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of memory-die metal bonding structures 880 configured to be bonded to a subset of an array of redistribution-side bonding structures 938 within a unit area UA. The HBM die 810 may be configured to provide a high bandwidth as defined under JEDEC standards, i.e., standards defined by The JEDEC Solid State Technology Association.

A second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. The second underfill material portion 292 may be formed between the redistribution structure 920 and the packaging substrate 200. The second underfill material portion 292 may contact each of the second solder material portions 290 (which may be C4 solder balls or C2 solder caps), and may contact vertical sidewalls of the fan-out package 900. The second underfill material portion laterally surrounds, and contacts, the array of second solder material portions 290 and the fan-out package 900.

Optionally, a stabilization structure 294, such as a cap structure or a ring structure, may be attached to the assembly of the fan-out package 900 and the packaging substrate 200 to reduce deformation of the assembly during subsequent processing steps and/or during usage of the assembly.

Figure 9:
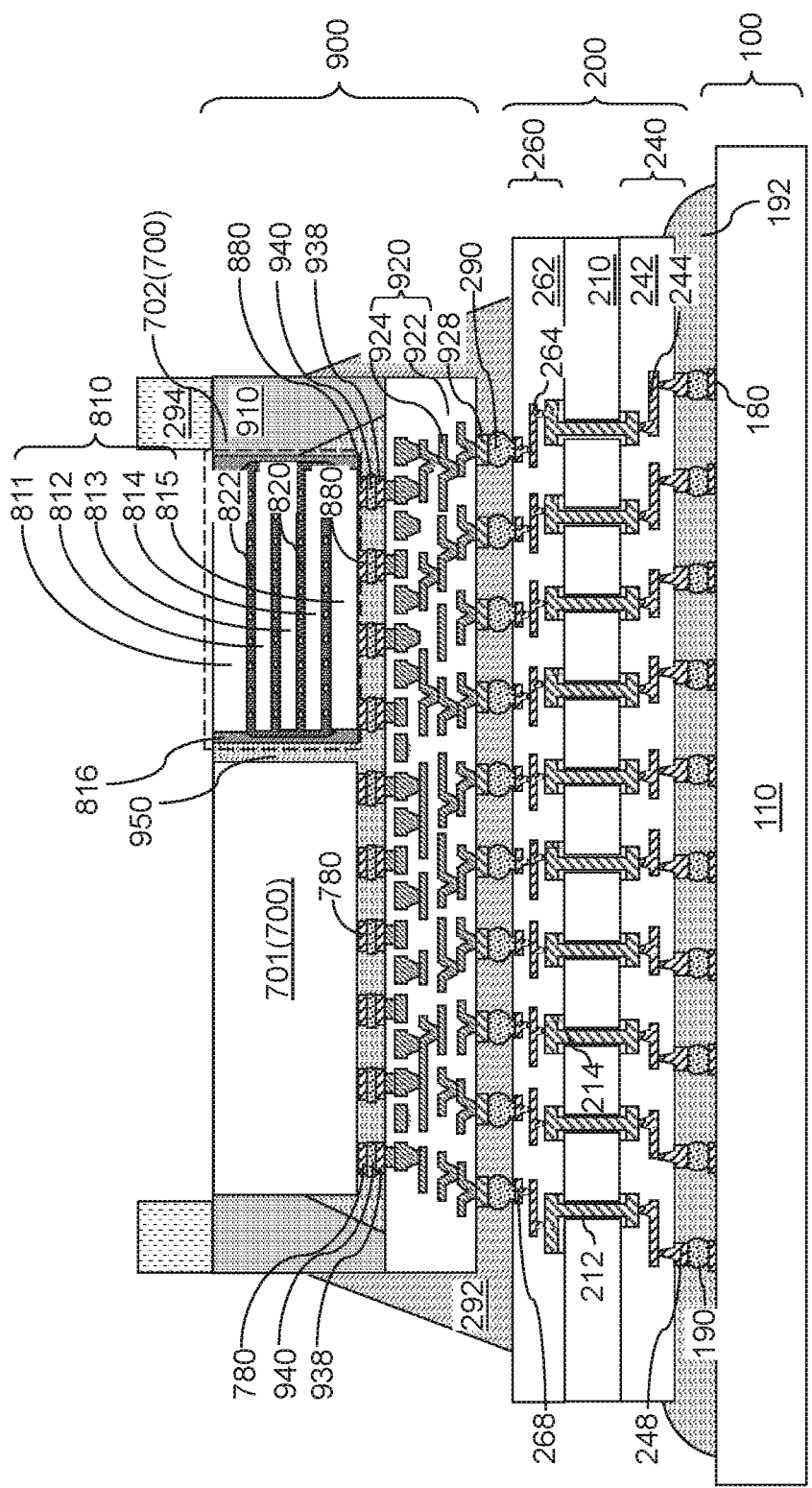
FIG. 9 is a vertical cross-sectional view of the exemplary structure after the packaging substrate is attached to a printed circuit board (PCB) according to an embodiment of the present disclosure.

Referring to FIG. 9, a printed circuit board (PCB) 100 including a PCB substrate 110 and PCB bonding pads 180 may be provided. The PCB 100 may include a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

Figure 10:
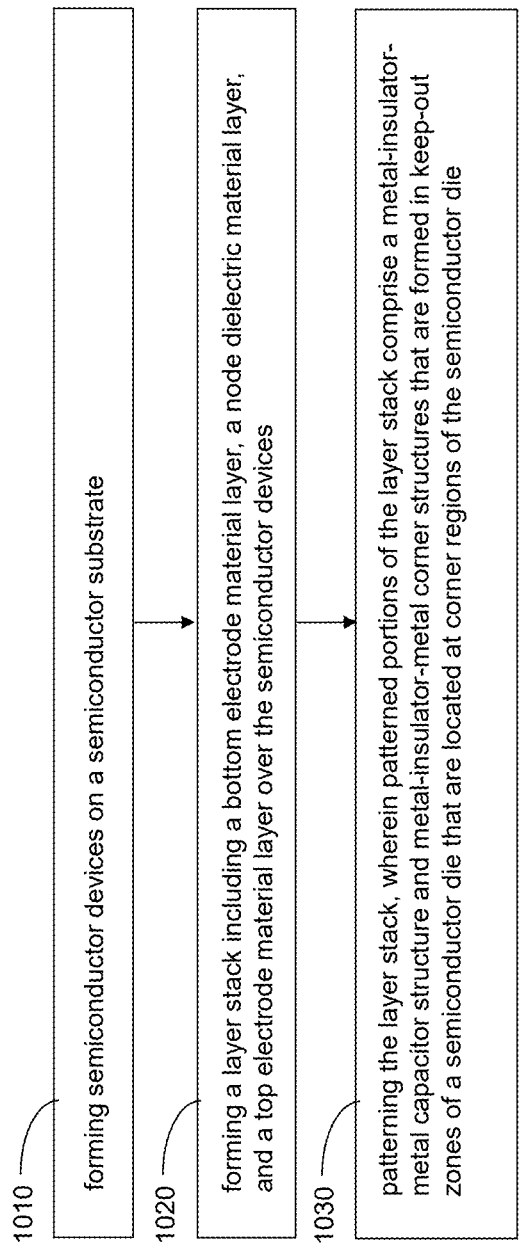
FIG. 10 is a flowchart illustrating steps for forming a semiconductor die of the present disclosure according to an embodiment of the present disclosure.

Referring to FIG. 10, a flowchart illustrates steps for forming an exemplary structure according to an embodiment of the present disclosure.

Referring to step 1010 and FIG. 1A, semiconductor devices 710 may be formed on a semiconductor substrate 709.

Referring to step 1020 and FIG. 1B, a layer stack including a bottom electrode material layer 741L, a node dielectric material layer 742L, and a top electrode material layer 743L may be formed over the semiconductor devices 710.

Referring to step 1030 and FIGS. 1C and 2A-2C, the layer stack (741L, 742L, 743L) may be patterned. Patterned portions of the layer stack (741L, 742L, 743L) comprise a metal-insulator-metal capacitor structure 740 and metal-insulator-metal corner structures 745 that are formed in keep-out zones (KOZ's) of a semiconductor die 700 that are located at corner regions of the semiconductor die 700. Each of the metal-insulator-metal corner structures 745 has a horizontal cross-sectional shape selected from a triangular shape and a polygonal shape including a pair of laterally-extending strips 745S extending along two horizontal directions that are perpendicular to each other and connected to each other by a connecting shape (745R or 745T).

The various structures and methods of the present disclosure may be used to provide a semiconductor die that may be more resistant to propagation of cracks or fractures in the passivation layers 750. Specifically, cracks that start in the upper passivation layer 752 or from above the upper passivation layer 752 in any of the keep-out zones (KOZ's) may be stopped by the metal-insulator-metal corner structures 745. Further, formation of the metal-insulator-metal corner structures 745 does not add any additional cost in embodiments in which the semiconductor die 700 is designed with metal-insulator-metal capacitor structures 740. In such embodiments, a simple change in the design layout of a mask may add metal-insulator-metal corner structures 745 into a semiconductor die 700 without any added extra cost. Thus the various embodiments and methods of the present disclosure may increase the reliability and yield of semiconductor dies, and may protect semiconductor dies from mechanical damages during subsequent handling or usage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die comprising:
semiconductor devices located on a semiconductor substrate; and
metal-insulator-metal corner structures overlying the semiconductor devices and located in corner regions of the semiconductor die, wherein;
each of the metal-insulator-metal corner structures comprises a bottom corner plate, a dielectric corner plate overlying the bottom corner plate, and a top corner plate overlying the dielectric corner plate; and
each of the metal-insulator-metal corner structures has a horizontal cross-sectional shape selected from a triangular shape and a non-triangular polygonal shape, wherein the non-triangular polygonal shape includes a connecting shape and two laterally-extending strips, and the two laterally-extending strips extend along two horizontal directions that are perpendicular to each other and the two laterally-extending strips are connected to each other by the connecting shape.

2. The semiconductor die of claim 1, further comprising a metal-insulator-metal capacitor structure comprising a bottom capacitor plate, a node dielectric layer, and a top capacitor plate, and located at a same vertical distance from the semiconductor substrate as the metal-insulator-metal corner structures are from the semiconductor substrate.

3. The semiconductor die of claim 2, further comprising metal interconnect structures electrically connected to the semiconductor devices and located within dielectric material layers and interposed between the semiconductor devices and a horizontal plane including bottom surfaces of the metal-insulator-metal corner structures and the metal-insulator-metal capacitor structure.

4. The semiconductor die of claim 2, wherein:
the bottom corner plate comprises a same material and has a same thickness as the bottom capacitor plate;
the dielectric corner plate comprises a same material and has a same thickness as the node dielectric layer; and
the top corner plate comprises a same material and has a same thickness as the top capacitor plate.

5. The semiconductor die of claim 1, wherein:
the semiconductor die comprises a pair of lengthwise sidewalls laterally extending along a first horizontal direction and a pair of widthwise sidewalls laterally extending along a second horizontal direction; and
each of the metal-insulator-metal corner structures has a first straight sidewall that is parallel to the first horizontal direction and a second straight sidewall that is parallel to the second horizontal direction.

6. The semiconductor die of claim 5, wherein:
the horizontal cross-sectional shape is the non-triangular polygonal shape including the two laterally-extending strips;
each of the two laterally-extending strips has a respective uniform width along a respective widthwise direction; and the connecting shape comprises a rectangular shape including a side located within the first straight sidewall and another side located within the second straight sidewall.

7. The semiconductor die of claim 5, wherein:

the horizontal cross-sectional shape is the polygonal shape including the two laterally-extending strips;

each of the two laterally-extending strips has a respective uniform width along a respective widthwise direction; and the connecting shape comprises a triangular shape including a side located within the first straight sidewall and another side located within the second straight sidewall.

8. The semiconductor die of claim 1, further comprising:

a lower passivation layer underlying the metal-insulator-metal corner structures and overlying the semiconductor devices; and an upper passivation layer overlying the metal-insulator-metal corner structures and contacting portions of a top surface of the lower passivation layer, wherein the bottom corner plate and the top corner plate of each of the metal-insulator-metal corner structures are electrically isolated from the semiconductor devices.

9. A semiconductor die comprising:

semiconductor devices located on a semiconductor substrate;

metal-insulator-metal corner structures overlying the semiconductor devices and located in corner regions of the semiconductor die, wherein each of the metal-insulator-metal corner structures comprises:

a bottom corner plate;

a dielectric corner plate overlying the bottom corner plate; and a top corner plate overlying the dielectric corner plate, wherein:

the semiconductor die further comprises a pair of lengthwise sidewalls laterally extending along a first horizontal direction and a pair of widthwise sidewalls laterally extending along a second horizontal direction;

each of the metal-insulator-metal corner structures has a first straight sidewall that is parallel to the first horizontal direction and a second straight sidewall that is parallel to the second horizontal direction; and each of the metal-insulator-metal corner structures has a respective corner edge and has a respective variable first lateral extent along the first horizontal direction such that the respective variable first lateral extent decreases stepwise or continuously as a function of a distance along the second horizontal direction from the respective corner edge, and has a respective variable second lateral extent along the second horizontal direction such that the respective variable second lateral extent decreases stepwise or continuously as a function of a distance along the first horizontal direction from the respective corner edge.

10. The semiconductor die of claim 9, further comprising a metal-insulator-metal capacitor structure comprising a bottom capacitor plate, a node dielectric layer, and a top capacitor plate, and located at a same vertical distance from the semiconductor substrate as the metal-insulator-metal corner structures are from the semiconductor substrate.

11. The semiconductor die of claim 10, further comprising metal interconnect structures electrically connected to the semiconductor devices and located within dielectric material layers and interposed between the semiconductor devices and a horizontal plane including bottom surfaces of the metal-insulator-metal corner structures and the metal-insulator-metal capacitor structure.

12. The semiconductor die of claim 9, wherein:

each of the metal-insulator-metal corner structures comprises a horizontal cross-sectional shape that is a triangular shape; and a first side and a second side of the triangular shape are located within the first straight sidewall and the second straight sidewall, respectively, of a respective one of the metal-insulator-metal corner structures.

13. The semiconductor die of claim 9, wherein:

each of the metal-insulator-metal corner structures comprises a horizontal cross-sectional shape that is a polygonal shape including a pair of laterally-extending strips;

each of the laterally-extending strips has a respective uniform width along a respective widthwise direction;

for each pair of laterally-extending strips, the respective laterally-extending strips of the pair are connected to each other by a respective rectangular connecting shape; and for each pair of laterally-extending strips, the respective rectangular connecting shape comprises a side located within the first straight sidewall of a respective one of the metal-insulator-metal corner structures and another side located within the second straight sidewall of the respective one of the metal-insulator-metal corner structures.

14. The semiconductor die of claim 9, wherein:

each of the metal-insulator-metal corner structures comprises a horizontal cross-sectional shape that is a polygonal shape including a pair of laterally-extending strips;

each of the laterally-extending strips has a respective uniform width along a respective widthwise direction;

for each pair of laterally-extending strips, the respective laterally-extending strips of the pair are connected to each other by a respective triangular connecting shape; and for each pair of laterally-extending strips, the respective triangular connecting shape comprises a side located within the first straight sidewall of a respective one of the metal-insulator-metal corner structures and another side located within the second straight sidewall of the respective one of the metal-insulator-metal corner structures.

15. A method of forming a semiconductor structure, comprising:

forming semiconductor devices on a semiconductor substrate;

forming a layer stack including a bottom electrode material layer, a node dielectric material layer, and a top electrode material layer over the semiconductor devices; and patterning the layer stack, wherein:

patterned portions of the layer stack comprise a metal-insulator-metal capacitor structure and metal-insulator-metal corner structures that are formed in corner regions of a semiconductor die that are located at corner regions of the semiconductor die; and each of the metal-insulator-metal corner structures has a horizontal cross-sectional shape selected from a triangular shape and a non-triangular polygonal shape, wherein the non-triangular polygonal shape includes a connecting shape and two laterally-extending strips, and the two laterally-extending strips extend along two horizontal directions that are perpendicular to each other and the two laterally-extending strips are connected to each other by the connecting shape.

16. The method of claim 15, further comprising forming metal interconnect structures over the semiconductor devices, wherein:

the metal interconnect structures are formed within dielectric material layers and are electrically connected to the semiconductor devices; and the layer stack is formed over the dielectric material layers.

17. The method of claim 15, further comprising dicing the semiconductor die by cutting through material portions located over the semiconductor substrate and through the semiconductor substrate, wherein:

the semiconductor die as diced comprises a pair of lengthwise sidewalls laterally extending along a first horizontal direction and a pair of widthwise sidewalls laterally extending along a second horizontal direction; and each of the metal-insulator-metal corner structures has a first straight sidewall that is parallel to the first horizontal direction and a second straight sidewall that is parallel to the second horizontal direction.

18. The method of claim 17, wherein:

the horizontal cross-sectional shape is the triangular shape; and a first side and a second side of the triangular shape are located within the first straight sidewall and the second straight sidewall, respectively.

19. The method of claim 17, wherein:

the horizontal cross-sectional shape is the non-rectangular polygonal shape;

each of the two laterally-extending strips has a respective uniform width along a respective widthwise direction; and the connecting shape comprises a rectangular shape or a triangular shape including a side located within the first straight sidewall and another side located within the second straight sidewall.

\* \* \* \* \*